(12) United States Patent
Akiba et al.

(10) Patent No.: US 10,163,791 B2
(45) Date of Patent: Dec. 25, 2018

(54) SEMICONDUCTOR DEVICE

(71) Applicant: Renesas Electronics Corporation, Koutou-ku, Tokyo (JP)

(72) Inventors: Toshihiko Akiba, Tokyo (JP); Shuuichi Kariyazaki, Tokyo (JP)

(73) Assignee: Renesas Electronics Corporation, Tokyo ( * ) Notice: Subject to any disclaimer, the term of this patent is extended or adjusted under 35 U.S.C. 154(b) by 0 days.

(21) Appl. No.: 15/721,784

(22) Filed: Sep. 30, 2017

(65) Prior Publication Data
US 2018/0158771 A1 Jun. 7, 2018

(30) Foreign Application Priority Data

Dec. 6, 2016 (JP) .................... 2016-236713

(51) Int. Cl.
*H01L 23/48* (2006.01)
*H01L 23/52* (2006.01)
(Continued)

(52) U.S. Cl.
CPC ............ *H01L 23/528* (2013.01); *H01L 23/15* (2013.01); *H01L 23/49816* (2013.01); *H01L 23/49822* (2013.01); *H01L 23/49827* (2013.01); *H01L 23/49838* (2013.01); *H01L 24/49* (2013.01); *H01L 24/97* (2013.01); *H01L 24/16* (2013.01); *H01L 24/17* (2013.01); *H01L 25/0652* (2013.01); *H01L 25/0655* (2013.01); *H01L 25/18* (2013.01); *H01L 2224/0401* (2013.01); *H01L 2224/16146* (2013.01); *H01L 2224/16227* (2013.01); *H01L 2224/17181* (2013.01); *H01L 2224/4901* (2013.01); *H01L 2224/494* (2013.01); *H01L 2225/06513* (2013.01); *H01L 2225/06517* (2013.01);
(Continued)

(58) Field of Classification Search
None
See application file for complete search history.

(56) References Cited

U.S. PATENT DOCUMENTS

2009/0173530 A1* 7/2009 Sakamoto ........... H01L 21/4857
174/261
2014/0264769 A1* 9/2014 Chen ...................... H01L 22/14
257/620

FOREIGN PATENT DOCUMENTS

JP 2001-016007 A 1/2001
JP 2012-238804 A 12/2012

* cited by examiner

*Primary Examiner* — Calvin Y Choi
(74) *Attorney, Agent, or Firm* — Shapiro, Gabor and Rosenberger, PLLC

(57) ABSTRACT

It is intended to reduce the price of a semiconductor device and increase the reliability thereof. In an interposer, a plurality of wiring layers are disposed between uppermost-layer wiring and lowermost-layer wiring. For example, a third wiring layer is electrically coupled directly to a first wiring layer as the uppermost-layer wiring by a long via wire extending through insulating layers without intervention of a second wiring layer. For example, an upper-surface terminal made of the first wiring layer is electrically coupled directly to a via land made of the third wiring layer by the long via wire. Between the adjacent long via wires, three lead-out wires made of the second wiring layer can be placed. The number of the lead-out wires that can be placed between the adjacent long via wires is larger than the number of the lead-out wires that can be placed between the adjacent via lands.

14 Claims, 20 Drawing Sheets

(51) Int. Cl.
  *H01L 29/40* (2006.01)
  *H01L 23/528* (2006.01)
  *H01L 23/15* (2006.01)
  *H01L 23/00* (2006.01)
  *H01L 23/498* (2006.01)
  H01L 25/065 (2006.01)
  H01L 25/18 (2006.01)
(52) U.S. Cl.
  CPC ............... *H01L 2225/06541* (2013.01); *H01L 2225/06565* (2013.01); *H01L 2924/1431* (2013.01); *H01L 2924/1434* (2013.01); *H01L 2924/15192* (2013.01); *H01L 2924/15311* (2013.01)

*FIG. 10*

| ITEM | SIZE | NUMBER OF LEAD-OUT WIRES |
|---|---|---|
| Min pitch | 55μm | — |
| Stagger pitch | 27.5μm | — |
| Land | φ30μm | — |
| Via | φ20μm | — |
| Land-Land space | 25μm | 2 |
| Land-Via space | 30μm | 2 |
| Via-Via space | 35μm | 3 |

Line/Space = 5μm/5μm

FIG. 17

| ITEM | SIZE | NUMBER OF LEAD-OUT WIRES |
|---|---|---|
| Min pitch | 55μm | — |
| Stagger pitch | 27.5μm | — |
| Land | φ30μm | — |
| Via | φ5μm | — |
| Land-Land space | 25μm | 5 |
| Land-Via space | 37.5μm | 8 |
| Via-Via space | 50μm | 12 |

Line/Space = 2μm/2μm

SEMICONDUCTOR DEVICE

CROSS-REFERENCE TO RELATED APPLICATIONS

The disclosure of Japanese Patent Application No. 2016-236713 filed on Dec. 6, 2016 including the specification, drawings and abstract is incorporated herein by reference in its entirety.

BACKGROUND

The present invention relates to a semiconductor device and can be used appropriately for a semiconductor device in which a plurality of semiconductor components such as, e.g., semiconductor chips are electrically coupled to each other via an interposer.

Japanese Unexamined Patent Publication No. 2012-238804 (Patent Document 1) describes a printed wiring board in which an IC chip is embedded in a first resin insulating layer, a second resin insulating layer is formed over the first resin insulating layer, and a second conductor layer thicker than a third conductor layer is disposed at the interface between the first and second resin insulating layers.

On the other hand, Japanese Unexamined Patent Publication No. 2001-016007 (Patent Document 2) describes a wiring substrate formed with a transmission line including a strip line, a dielectric layer formed so as to surround the strip line, two ground lines between which the dielectric layer is interposed in a vertical direction, and two elongated-hole-shaped via conductors which conductively couple the two ground lines to each other and between which the dielectric layer is interposed in a lateral direction.

RELATED ART DOCUMENTS

Patent Documents

[Patent Document 1] Japanese Unexamined Patent Publication No. 2012-238804
[Patent Document 2] Japanese Unexamined Patent Publication No. 2001-016007

SUMMARY

For example, in 2.5-dimensional (2.5D) mounting, a memory chip is electrically coupled to a logic chip via a plurality of lead-out wires formed in an interposer. However, since the density of wires between the chips is limited, the number of the inter-chip lead-out wires formed in each of the substrate layers of the interposer is limited. Accordingly, in order to increase the total number of the inter-chip lead-out wires formed in the interposer, it is necessary to increase the number of the substrate layers. This causes a problem in that the cost of a semiconductor device cannot be reduced.

Other problems and novel features of the present invention will become apparent from a statement in the present specification and the accompanying drawings.

According to an embodiment, a semiconductor device includes an interposer. The interposer includes a first wiring layer, a second wiring layer disposed closer to a lower surface of the interposer than the first wiring layer, a third wiring layer disposed closer to the lower surface of the interposer than the first wiring layer, and a fourth wiring layer disposed between the first and second wiring layers and between the first and third wiring layers. The interposer further includes first and second land electrodes each made of the first wiring layer, a third land electrode made of the second wiring layer, and a fourth land electrode made of the third wiring layer. The interposer further includes a first through electrode extending through the fourth wiring layer and having one end coupled to the first land electrode and the other end coupled to the third land electrode and a second through electrode extending through the fourth wiring layer and having one end coupled to the second land electrode and the other end coupled to the fourth land electrode. Some of a plurality of wires formed of the fourth wiring layer are disposed between the first and second through electrodes.

According to the embodiment, it is possible to reduce the price of the semiconductor device and increase the reliability thereof.

BRIEF DESCRIPTION OF THE DRAWINGS

FIG. 10 is a table showing an example of layout rules for the individual wiring layers included in the interposer;

FIG. 17 is a table showing an example of layout rules for the individual wiring layers included in the silicon interposer;

DETAILED DESCRIPTION

Figure 1:
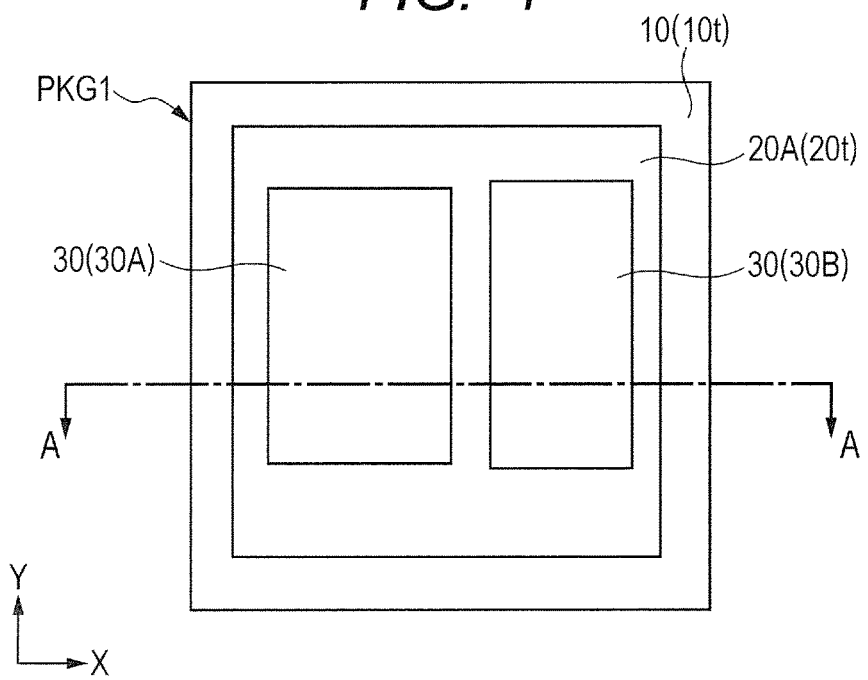
FIG. 1 is a top view showing a semiconductor device according to Embodiment 1.

In the following embodiments, if necessary for the sake of convenience, each of the embodiments will be described by being divided into a plurality of sections or embodiments. However, they are by no means irrelevant to each other unless particularly explicitly described otherwise, but are in relations such that one of the sections or embodiments is modifications, details, supplementary explanation, and so forth of part or the whole of the others.

Also, in the following embodiments, when the number and the like (including the number, numerical value, amount, range, and the like) of elements are mentioned, they are not limited to the specified numbers unless particularly explicitly described otherwise or unless they are obviously limited to specified numbers in principle. The number and the like of the elements may be not less than or not more than the specified numbers.

Also, in the following embodiments, the components thereof (including also elements, steps, and the like) are not necessarily indispensable unless particularly explicitly described otherwise or unless the components are considered to be obviously indispensable in principle.

It will also be appreciated that, when the wording "comprised of A", "comprising A", "having A", or "including A" is used for a component A, it does not exclude a component other than the component A unless it is shown particularly explicitly that the component A is the only one component. Likewise, when the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

In the following embodiments, X-, Y-, and Z-directions are used for illustrative purposes. The X- and Y-directions are orthogonal to each other to form a horizontal plane, while the Z-direction is vertical to the horizontal plane.

In each of the cross-sectional views and plan views used in the following embodiments, the sizes of individual portions do not correspond to those in a real device. For improved clarity of illustration, a specific portion may be shown in a relatively large size. Even when a cross-sectional view and a plan view correspond to each other, for improved clarity of illustration, a specific portion may be shown in a relatively large size. Also, in the drawings used in the following embodiments, hatching may be omitted even in a cross section for improved clarity of illustration, while even a plan view may be hatched for improved clarity of illustration.

Note that, throughout all the drawings for illustrating the embodiments, members having the same functions are designated by the same reference numerals in principle, and a repeated description thereof is omitted.

The following will describe the embodiments in detail on the basis of the drawings.

(Embodiment 1)

In Embodiment 1, as an example of a semiconductor device in which a plurality of semiconductor components are electrically coupled to each other via an interposer, an embodiment will be described in which a plurality of semiconductor chips are mounted over an interposer using a build-up substrate made of an insulating material obtained by impregnating a fibrous material such as glass fiber with a resin material such as an epoxy resin (hereinafter referred to simply as the interposer). Specifically, the semiconductor device described by way of example in Embodiment 1 has a memory chip in which a memory circuit is formed and a logic chip in which a control circuit for controlling the operation of the memory circuit of the memory chip and an arithmetic processing circuit are formed. The memory chip is electrically coupled to the logic chip via the interposer to form a system in a single package. Such a semiconductor device in which a system is formed in a single package is referred to as a SiP (System in Package). Also, a semiconductor device in which a plurality of semiconductor chips are mounted in a single package is referred to as a MCM (Multi Chip Module).

<Outline of Semiconductor Device>

Figure 2:
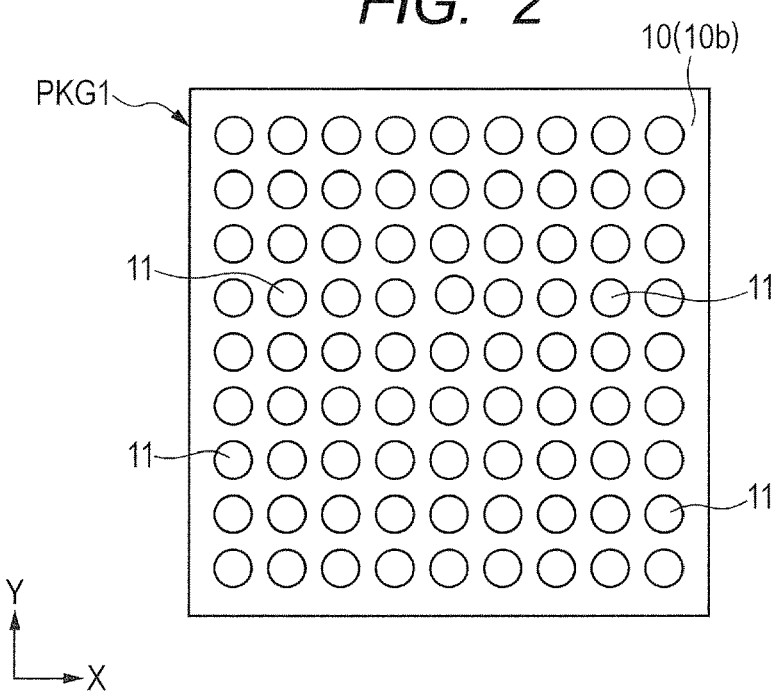
FIG. 2 is a bottom view of the semiconductor device shown in FIG. 1.
Figure 3:
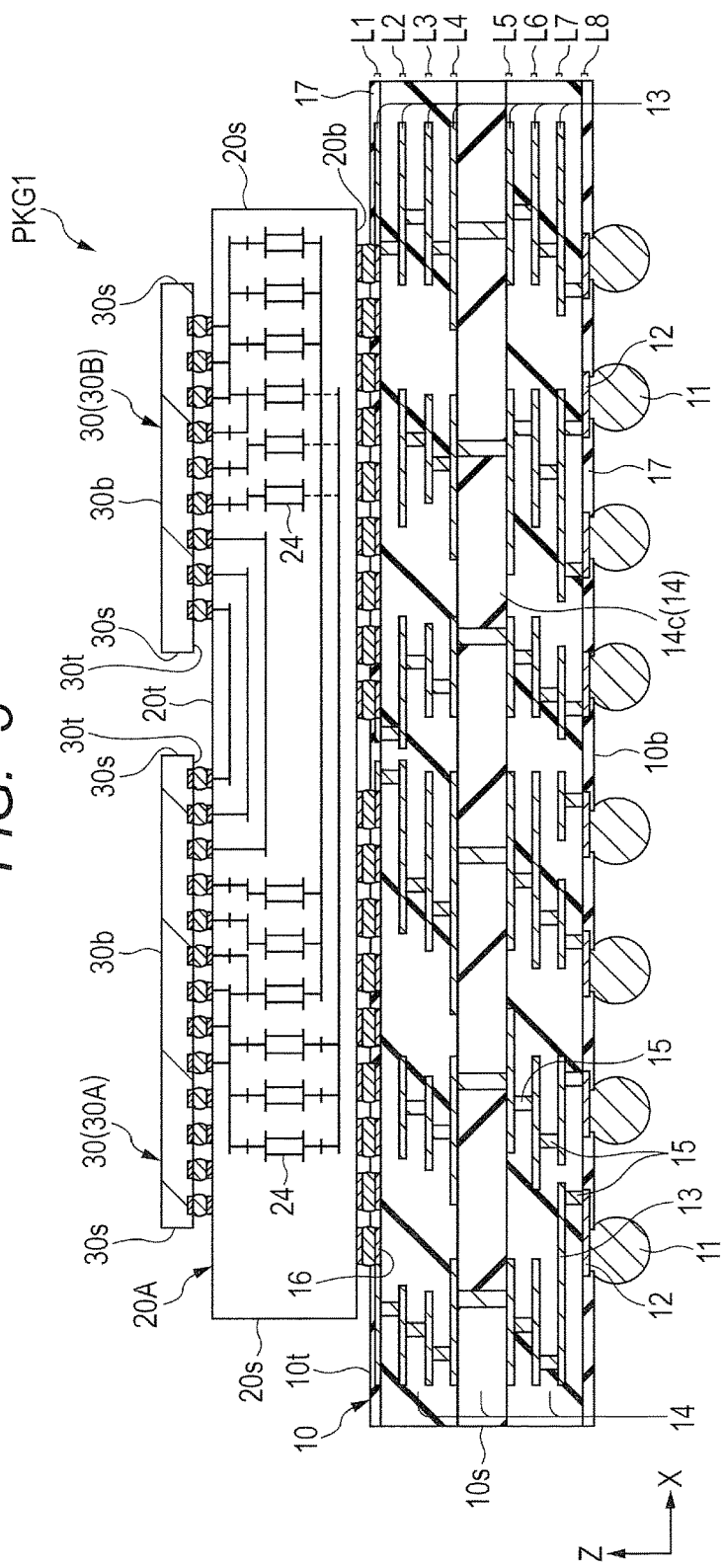
FIG. 3 is a cross-sectional view along the line A-A in FIG. 1.
Figure 4:
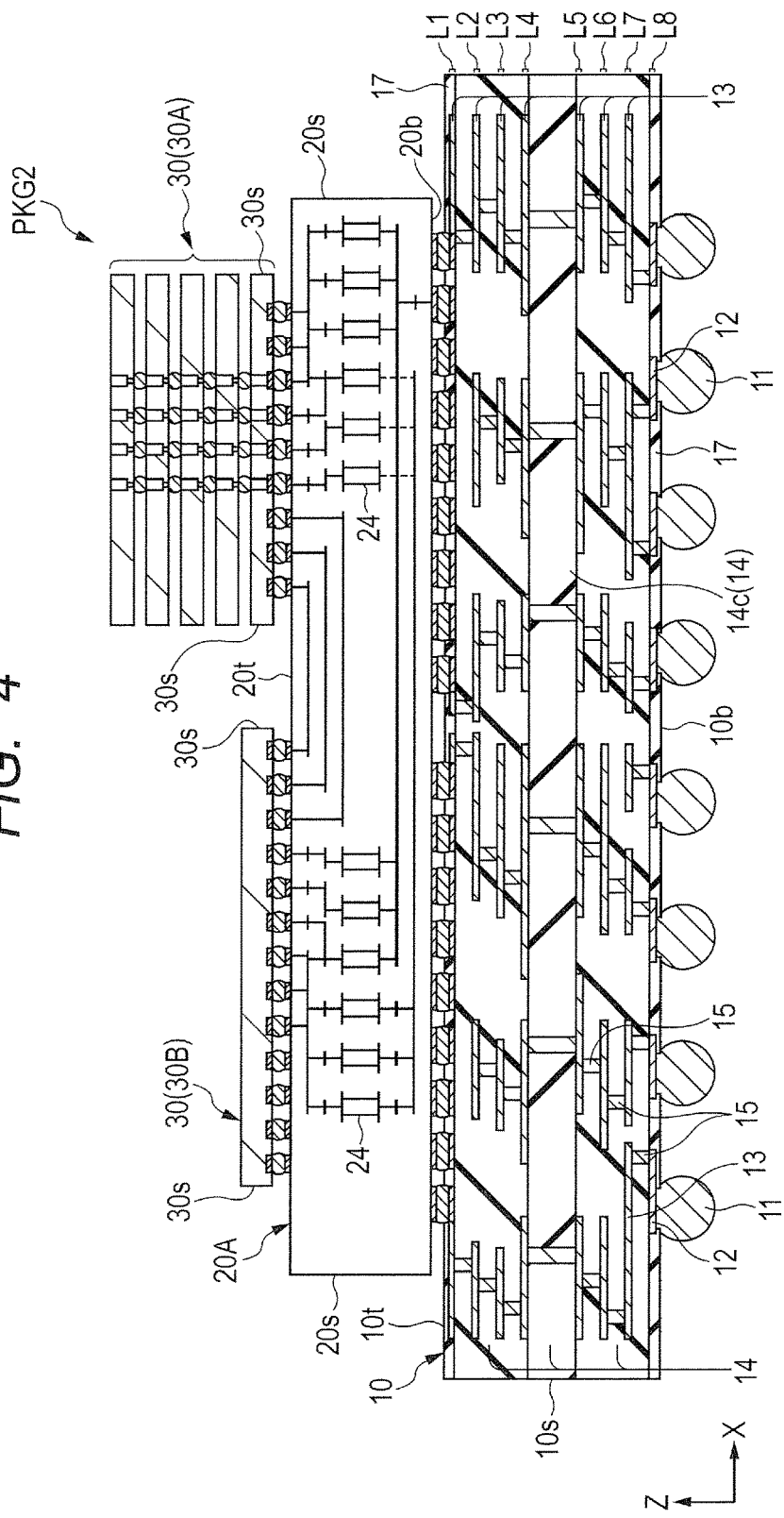
FIG. 4 is a cross-sectional view of a first modification of the semiconductor device according to Embodiment 1.
Figure 5:
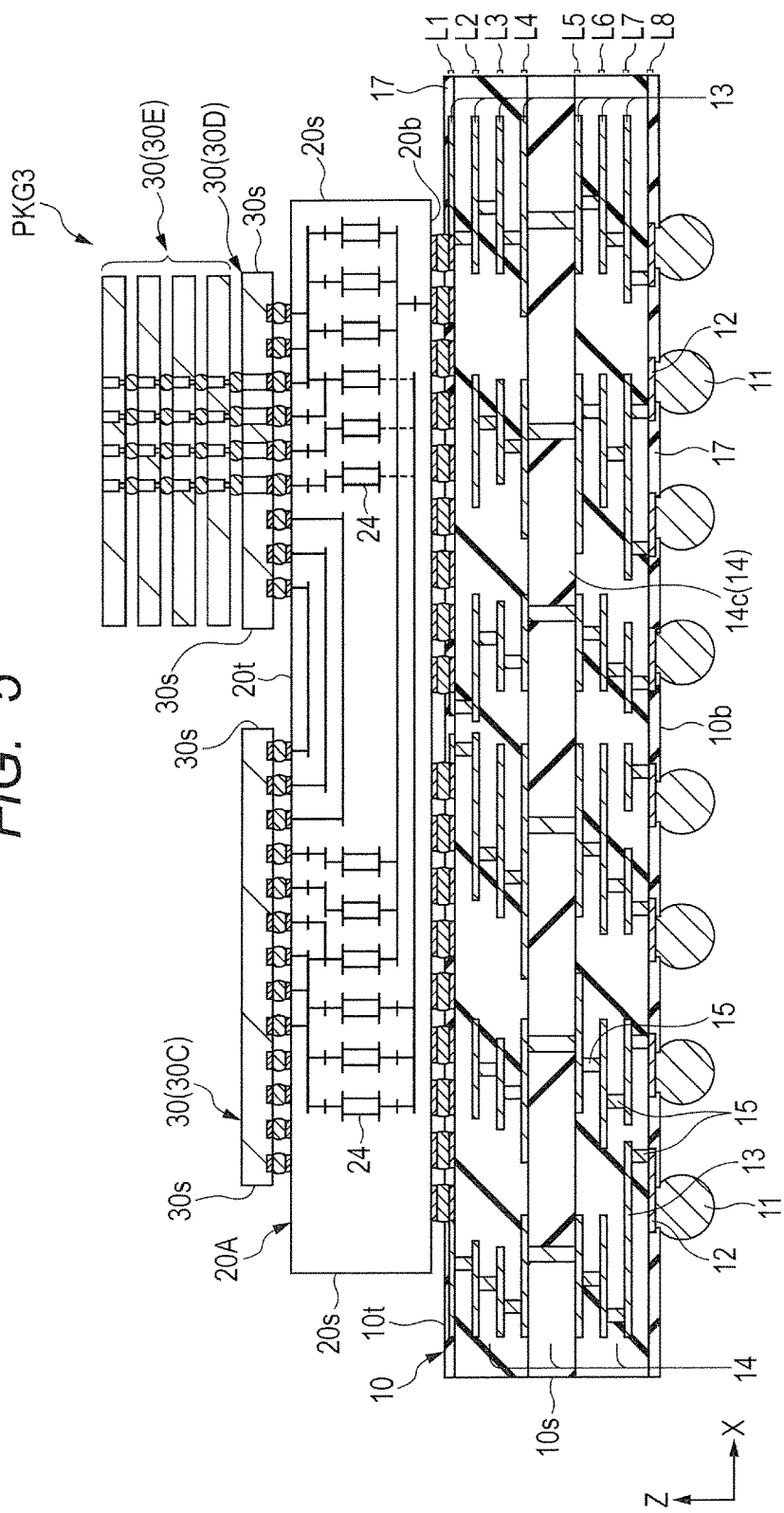
FIG. 5 is a cross-sectional view of a second modification of the semiconductor device according to Embodiment 1.
Figure 6:
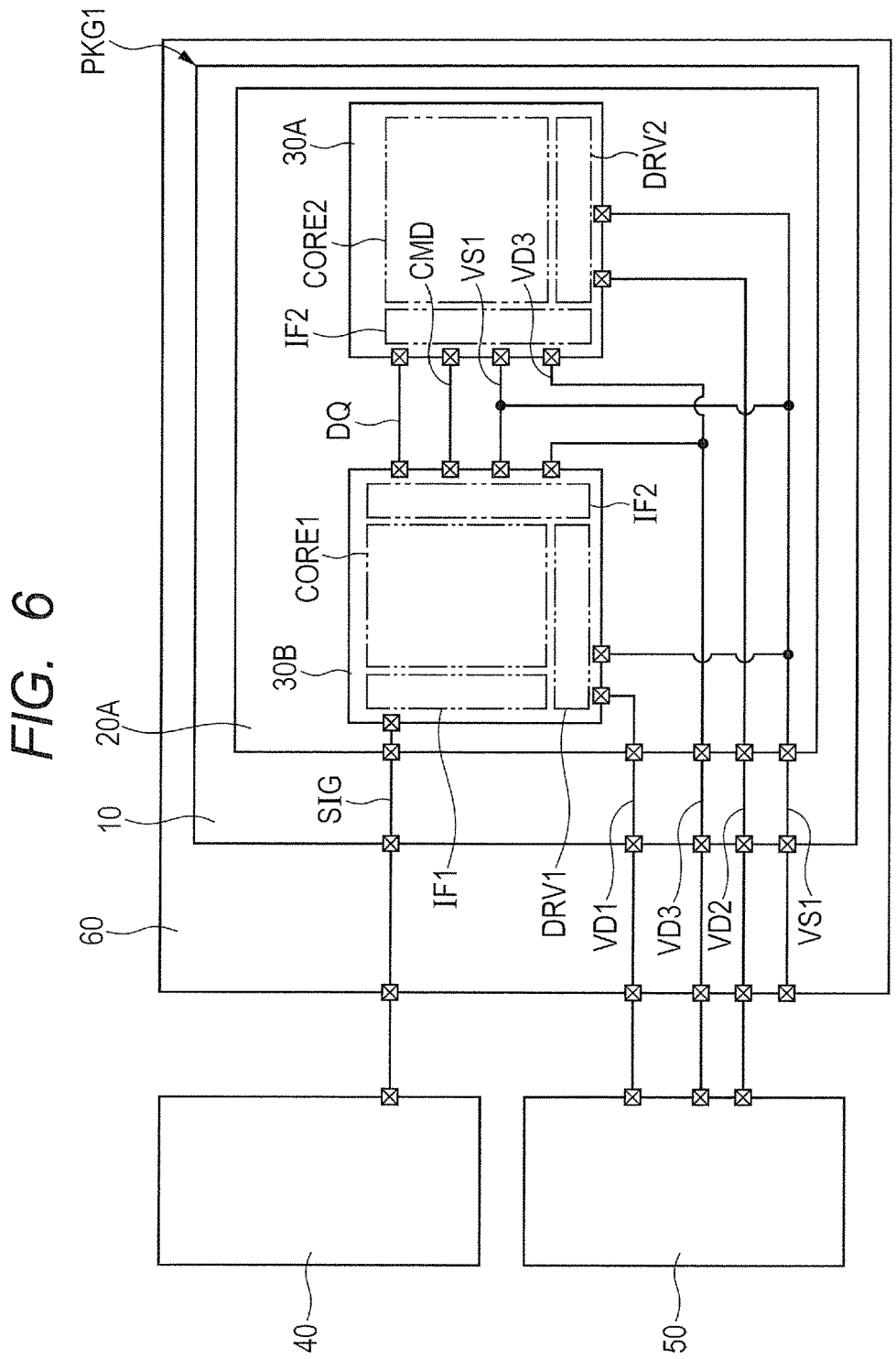
FIG. 6 is an illustrative view showing an example of a circuit configuration when the semiconductor device shown in FIGS. 1, 2, and 3 is mounted over a mounting substrate.

First, using FIGS. 1 to 6, a description will be given of the outline of a structure of the semiconductor device according to Embodiment 1. FIG. 1 is a top view of the semiconductor device according to Embodiment 1. FIG. 2 is a bottom view of the semiconductor device shown in FIG. 1. FIG. 3 is a cross-sectional view along the line A-A in FIG. 1. FIG. 4 is a cross-sectional view of a first modification of the semiconductor device according to Embodiment 1. FIG. 5 is a cross-sectional view of a second modification of the semiconductor device according to Embodiment 1. FIG. 6 is an illustrative view showing an example of a circuit configuration when the semiconductor device shown in FIGS. 1, 2, and 3 is mounted over a mounting substrate.

Note that, for improved clarity of illustration, the number of the terminals shown in FIGS. 2 to 5 is set smaller than that of the real terminals. However, the number of the terminals have various modifications other than that in the embodiment shown in FIGS. 2 to 5. For example, the number of solder balls 11 shown in FIG. 2 may be larger than the number shown in FIG. 2. Also, for example, the number of terminals in a plurality of semiconductor chips 30 shown in FIG. 3 is over 1000.

In Embodiment 1, each of a wiring substrate 10 and an interposer 20A which are shown in FIGS. 3, 4, and 5 has a plurality of wiring layers. However, in FIGS. 3, 4, and 5, for improved clarity of illustration, some of the plurality of wires formed in the individual wiring layers are schematically shown. Also, in the example shown in FIG. 6, typical transmission paths among a large number of transmission paths provided in a semiconductor device PKG1 are shown by way of example.

As shown in FIGS. 1 and 3, the semiconductor device PKG1 according to Embodiment 1 has the wiring substrate (package substrate) 10, the interposer (interposer substrate) 20A mounted over the wiring substrate 10, and the plurality of semiconductor chips (semiconductor components) 30 mounted over the interposer 20A. The plurality of semiconductor chips 30 are mounted in juxtaposition over the interposer 20A.

Note that Embodiment 1 will describe an example in which the plurality of semiconductor chips 30 are mounted in juxtaposition over the interposer 20A. However, the semiconductor components mounted over the interposer 20A are not limited to the semiconductor chips 30, but have various modifications. For example, each or any of the plurality of semiconductor chips 30 mounted over the interposer 20A may also be replaced with a semiconductor chip multi-layer body (semiconductor component) in which a plurality of semiconductor chips are stacked or a semiconductor package (semiconductor component) in which a semiconductor chip is mounted over a wiring material such as a wiring substrate.

Specifically, Embodiment 1 will describe the example in which one of the plurality of semiconductor components mounted over the interposer 20A is a memory chip 30A including a memory circuit. Another one of the plurality of semiconductor components mounted over the interposer 20A is a logic chip 30B including a control circuit for controlling the foregoing memory circuit.

However, as in, e.g., a semiconductor device PKG2 shown in FIG. 4, instead of the memory chip 30A shown in FIG. 3, a multi-layer body in which a plurality of the memory chips 30A are stacked may also be mounted over the interposer 20A.

Also, as in, e.g., a semiconductor device PKG3 shown in FIG. 5, a host controller chip 30C in which a CPU (Central Processing Unit), a GPU (Graphics Processing Unit), or the like is formed, a logic chip 30D having a test function, a memory cell repair function, or the like, and a plurality of memory chips 30E stacked over the logic chip 30D using a through via technique may also be mounted over the interposer 20A.

Alternatively, instead of the memory chip 30A shown in FIG. 30, a semiconductor package in which a single or a plurality of memory chips (and controller chips) are electrically coupled to a wiring substrate (package substrate) and a plurality of external terminals are formed over the wiring substrate may also be mounted over the interposer 20A, though the illustration thereof is omitted.

As shown in FIG. 2, over a lower surface (surface or mounting surface) 10b of the wiring substrate 10 serving as the mounting surface of the semiconductor device PKG1, the plurality of solder balls (external terminals) 11 serving as the external terminals of the semiconductor device PKG1 are arranged in rows and columns (in the form of an array or a matrix). The plurality of solder balls 11 are coupled individually to lands (external terminals or solder coupling pads) 12 (see FIG. 3).

A semiconductor device in which a plurality of external terminals (solder balls 11 and lands 12) are arranged in rows and columns over the mounting surface in the same manner as in the semiconductor device PKG1 is referred to as an area array semiconductor device. In the area array semiconductor device PKG1, the mounting surface (lower surface 10b) of the wiring substrate 10 can effectively be used as a space where the external terminals are disposed. This is preferable because, even when the number of the external terminals increases, it is possible to suppress an increase in the mounting area of the semiconductor device PKG1. In other words, the semiconductor device PKG1 having a larger number of external terminals with increases in the functionality and integration thereof can be mounted in a space-saving manner.

As shown in FIG. 3, the wiring substrate 10 has an upper surface (surface or chip mounting surface) 10t over which the plurality of semiconductor chips 30 are mounted via the interposer 20A, the lower surface 10b opposite to the upper surface 10t, and side surfaces 10s disposed between the upper and lower surfaces 10t and 10b. As shown in FIG. 1, the wiring substrate 10 has a quadrilateral outer shape in plan view.

As also shown in FIG. 3, the interposer 20A has an upper surface (surface or chip mounting surface) 20t over which the plurality of semiconductor chips 30 are mounted, a lower surface (surface or chip mounting surface) 20b opposite to the upper surface 20t, and side surfaces 20s disposed between the upper and lower surfaces 20t and 20b. As hown in FIG. 1, the interposer 20A has a quadrilateral outer shape in plan view.

As also shown in FIG. 3, each of the plurality of semiconductor chips 30 has a top surface (main surface or upper surface) 30t, a back surface (main surface or lower surface) 30b opposite to the top surface 30t, and side surfaces 30s located between the top and back surfaces 30t and 30b. As shown in FIG. 1, each of the plurality of semiconductor chips 30 has a quadrilateral outer shape in plan view.

In Embodiment 1, one of the plurality of semiconductor chips 30 is the memory chip 30A including the memory circuit, and another one of the plurality of semiconductor chips 30 is the logic chip 30B including the control circuit for controlling the foregoing memory circuit. Also, in Embodiment 1, each of the memory chip 30A and the logic chip 30B is coupled directly to the interposer 20A. In other words, between the memory chip 30A and the interposer 20A and between the logic chip 30 and the interposer 20A, neither a substrate nor another chip component is interposed.

As shown in FIG. 6, the semiconductor device PKG1 according to Embodiment 1 includes a system which operates by transmitting a signal between the logic chip 30B and the memory chip 30A. The memory chip 30A includes a main storage circuit (storage circuit) which stores data communicated to/from the logic chip 30B. The logic chip 30B includes the control circuit which controls the operation of the main storage circuit of the memory chip 30A. The logic chip 30B also includes an arithmetic processing circuit which performs arithmetic processing on a data signal input thereto. In FIG. 6, by way of example, a main circuit such as the arithmetic operation circuit or the control circuit is shown as a core circuit (main circuit) CORE1.

However, as the circuit included in the core circuit CORE1, a circuit other than the circuits described above may also be included. For example, in the logic chip 30B, an auxiliary storage circuit (storage circuit) having a storage capacity smaller than that of the main storage circuit of the memory chip 30A, such as, e.g., a cache memory which temporarily stores data, may also be formed.

In the logic chip 30B, an external interface circuit (input/output circuit or external input/output circuit) IF1 which inputs/outputs a signal to/from an external device 40 is formed. The external interface circuit IF1 is coupled to a signal line SIG which transmits a signal between the logic chip 30B and the external device 40. The external interface circuit IF1 is coupled also to the core circuit CORE1. The core circuit CORE1 can transmit a signal to the external device 40 via the external interface circuit IF1.

In the logic chip 30B, an internal interface circuit (input/output circuit or internal input/output circuit) IF2 which inputs/outputs a signal to/from an internal device (e.g., memory chip 30A) is formed. The internal interface circuit IF2 is coupled to a data line (signal line) DQ which transmits a data signal and to a control signal line (signal line) CMD which transmits control data signals such as an address signal and a command signal. The data line DQ and the control signal line CMD are coupled to the internal interface circuit IF2 of the memory chip 30A.

The logic chip 30B includes a power supply circuit DRV1 supplied with a potential for driving the core circuit CORE1 and the input/output circuit. In the example shown in FIG. 6, the power supply circuit DRV1 is coupled to a power supply line VD1 which supplies a power supply potential and to a reference potential line VS1 which supplies a reference potential. The internal interface circuit IF2 is coupled to a power supply line VD3 which supplies a drive potential and to the reference potential line VS1 which supplies the reference potential.

In the example shown in FIG. 6, the potential for driving the core circuit CORE1 or the input/output circuit is supplied from a power supply 50 provided outside the semiconductor device PKG1.

Note that, in the example shown in FIG. 6, a pair of the power supply line VD1 and the reference potential line VS1 are coupled to the logic chip 30B. However, the method which supplies the potential to the logic chip 30B has various modifications other than the method described above. For example, the power supply circuit DRV1 may include an external interface power supply circuit supplied with a voltage for driving the external interface circuit IF1 of the logic chip 30B and a core power supply circuit supplied with a voltage for driving the core circuit CORE1 of the logic chip 30B. Alternatively, the power supply circuit DRV1 may also include an internal interface power supply circuit supplied with a voltage for driving the internal interface IF2 of the logic chip 30B. In this case, the logic chip 30B is coupled to the plurality of power supply lines VD1 which supply a plurality of different power supply potentials.

The potential supplied to the reference potential line VS1 shown in FIG. 6 is, e.g., a ground potential. However, since the drive voltage is defined by the difference between first and second potentials different from each other, the potential supplied to the reference potential line VS1 may also be other than the ground potential.

An integrated circuit in which circuits required for the operation of a certain device or system are formed integrally in the single semiconductor chip 30, such as the logic chip 30B, is referred to as a SoC (System on a Chip). When the main storage circuit shown in FIG. 6 is formed in the logic chip 30B, the logic chip 30B can solely form a system. However, depending on the device or system to be operated, the capacity required of the main storage circuit differs.

Accordingly, by forming the main storage circuit in the semiconductor chip 30 different from the logic chip 30B, i.e., the memory chip 30A, it is possible to increase the versatility of the logic chip 30B. In addition, by coupling a plurality of the memory chips 30A in accordance with the storage capacity required of the main storage circuit, the design flexibility of the capacity of the storage circuit included in the system is increased.

In the example shown in FIG. 6, the memory chip 30A includes the main storage circuit. In FIG. 6, the main storage circuit is shown as a core circuit (main circuit) CORE2 of the memory chip 30A. However, the core circuit CORE2 may also include a circuit other than the main storage circuit.

In the memory chip 30A, the internal interface circuit IF2 which inputs/outputs a signal to and from an internal device (e.g., logic chip 30B) is formed.

The memory chip 30A also includes a power supply circuit DRV2 supplied with a potential for driving the core circuit CORE2. In the example shown in FIG. 6, the power supply circuit DRV2 is coupled to a power supply line VD2 which supplies the power supply potential and to the reference potential line VS1 which supplies the reference potential. Also, the internal interface circuit IF2 is coupled to the power supply line VD3 which supplies the drive potential and to the reference potential line VS1 which supplies the reference potential.

In the example shown in FIG. 6, a potential for driving the core circuit CORE2 or the input/output circuit is supplied from the power supply 50 provided outside the semiconductor device PKG1.

Note that, in the example shown in FIG. 6, a pair of the power supply line VD2 and the reference potential line VS1 are coupled to the memory chip 30A. Also, the logic chip 30B is electrically coupled to the memory chip 30A via each of the power supply line VD3 supplied with the power supply potential for driving the internal interface circuit IF2 and the reference potential line VS1. However, the method which supplies the potential to the memory chip 30A has various modifications other than the method described above. For example, it may also be possible that the power supply potential for driving the internal interface circuit IF2 of the logic chip 30B and the power supply potential for driving the internal interface circuit IF2 of the memory chip 30A are supplied independently of each other.

In the example shown in FIG. 6, the plurality of transmission paths electrically coupling the logic chip 30B to the memory chip 30A include not only the data line DQ and the control signal line CMD, but also the reference potential line VS1. The reference potential line VS1 is a path which transmits, e.g., the reference signal for the data signal transmitted by the data line DQ. The reference potential line VS1 is supplied with, e.g., the ground potential as the reference potential. However, the reference potential line VS1 may also be supplied with a potential other than the ground potential as long as fluctuations in potential in the transmission path can be reduced.

Also, in the example shown in FIG. 6, each of the power supply line VD2 which supplies the power supply potential to the memory chip 30A and the reference potential line VS1 which supplies the reference potential to the memory chip 30A is coupled to the memory chip 30A without extending through the logic chip 30B. However, in a modification of FIG. 6, the power supply line VD1 and the reference potential line VS1 may also be coupled to the memory chip 30A through the logic chip 30B.

<Configurations of Individual Components>

Figure 7:
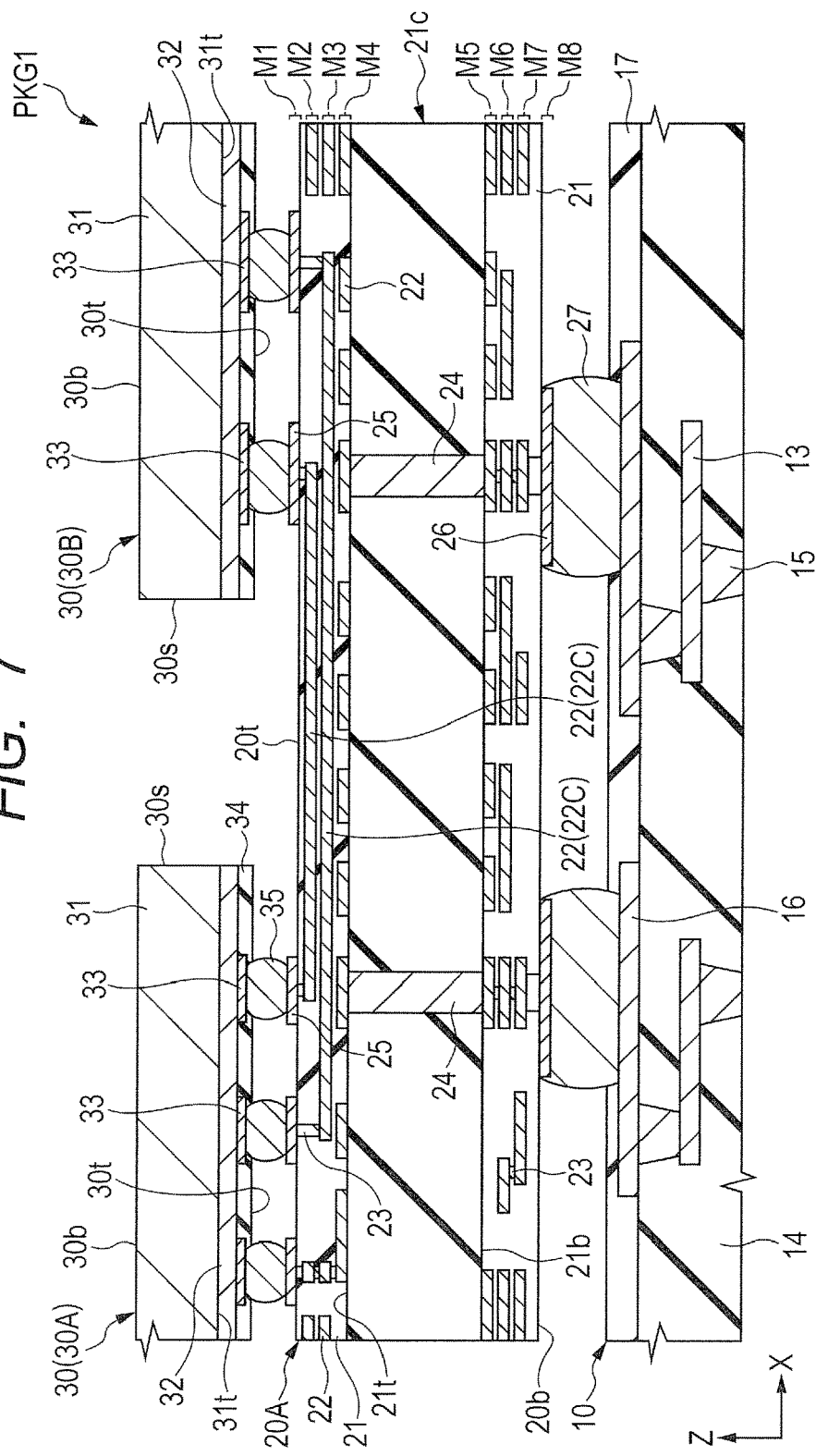
FIG. 7 is an enlarged cross-sectional view of a region between the adjacent semiconductor chips shown in FIG. 3.

Next, a description will be given of the main components of the semiconductor device PKG1 mainly using FIGS. 3 and 7. FIG. 7 is an enlarged cross-sectional view of a region between the adjacent semiconductor chips shown in FIG. 3.

The wiring substrate 10 shown in FIGS. 3 and 7 is the component of the semiconductor device PKG1 including the transmission paths which supply electric signals and potentials to/from a mounting substrate 60 (see FIG. 6). The wiring substrate 10 has a plurality of wiring layers (which are eight layers in the example shown in FIG. 3) electrically coupling the upper surface 10t to the lower surface 10b. A plurality of wires 13 provided in each of the wiring layers are covered with insulating layers 14 which provide insulation between the plurality of wires 13 and between the adjacent wiring layers.

The wiring substrate 10 is a so-called multi-layer wiring substrate including the plurality of stacked wiring layers. In the example shown in FIG. 3, the wiring substrate 10 includes the total eight wiring layers which are wiring layers L1, L2, L3, L4, L5, L6, L7, and L8 located in this order with increasing distance from the upper surface 10*t*. Each of the plurality of wiring layers has a conductor pattern of the wires 13 or the like. The conductor patterns adjacent to each other are covered with the insulating layers 14. However, the number of the wiring layers included in the wiring substrate 10 is not limited to that in the example shown in FIG. 3, and may be smaller or larger than eight.

In the example shown in FIG. 3, the wiring substrate 10 has a structure in which a core layer (core material, core insulating layer, or insulating layer) 14*c* is used as a base material, and a plurality of wiring layers are stacked over each of the upper and lower surfaces of the core layer 14*c*. The core layer 14*c* is an insulating layer serving as the base material of the wiring substrate 10 and made of an insulating material obtained by, e.g., impregnating a fibrous material such as glass fiber with a resin material such as an epoxy resin.

The respective insulating layers 14 stacked over the upper and lower surfaces of the core layer 14*c* are made of an organic insulating material such as, e.g., a thermosetting resin. The plurality of wiring layers stacked over the upper and lower surfaces of the core layer 14*c* are formed by, e.g., a build-up method. However, in a modification of FIG. 3, a so-called coreless substrate not having the core layer 14*c* may also be used.

The wiring substrate 10 also has via wires 15 as interlayer conductive paths provided between the individual wiring layers to couple the stacked wiring layers to each other in a thickness direction.

Over the upper surface 10*t* of the wiring substrate 10, a plurality of bonding pads (terminals, interposer-mounting-surface terminals, or electrodes) 16 are formed. The wires 13 provided in the uppermost wiring layer (wiring layer L1 closest to the upper surface 10*t*) among the plurality of wiring layers of the wiring substrate 10 are formed integrally with the bonding pads 16. In other words, the bonding pads 16 can be considered as portions of the wires 13. When the wires 13 are considered to be independent of and separate from the bonding pads 16, the portions of the upper surface 10*t* of the wiring substrate 10 which are exposed from an insulating film (solder resist film) 17 can be defined as the bonding pads 16. Conversely, the portions of the upper surface 10*t* of the wiring substrate 10 which are covered with the insulating film 17 can be defined as the wires 13.

On the other hand, over the lower surface 10*b* of the wiring substrate 10, the plurality of lands 12 are formed. To the plurality of lands 12, the solder balls 11 are individually coupled. The mounting substrate 60 and the semiconductor device PKG1, which are shown in FIG. 6, are electrically coupled to each other via the solder balls 11 shown in FIG. 3. That is, the plurality of solder balls 11 function as the external coupling terminals of the semiconductor device PKG1.

The plurality of solder balls 11 and the plurality of lands 12 are electrically coupled to the plurality of bonding pads 16 over the upper surface 10*t* via the plurality of wires 13 of the wiring substrate 10. Note that the wires 13 provided in the lowermost wiring layer (wiring layer L8 closest to the lower surface 10*b*) among the plurality of wiring layers of the wiring substrate 10 are formed integrally with the lands 12. In other words, the lands 12 can be considered as portions of the wires 13. When the wires 13 are considered to be independent of and separate from the lands 12, the portions of the lower surface 10*b* of the wiring substrate 10 which are exposed from the insulating film 17 can be defined as the lands 12. Conversely, the portions of the lower surface 10*b* of the wiring substrate 10 which are covered with the insulating film 17 can be defined as the wires 13.

As a modification of FIG. 3, the lands 12 may be allowed to function as external coupling terminals. In this case, the solder balls 11 are not coupled to the lands 12. Each of the plurality of lands 12 is exposed from the insulating film 17 at the lower surface 10*b* of the wiring substrate 10. In another modification of FIG. 3, instead of the solder balls 11 in the form of balls, a thin solder film may be coupled to the lands 12 to be allowed to function as an external coupling terminal. Alternatively, a gold (Au) film may be formed by, e.g., a plating method over the exposed surface to be used as an external coupling terminal. Still alternatively, the external coupling terminals may be formed into pin-like shapes (stick-like shapes).

The upper and lower surfaces 10*t* and 10*b* of the wiring substrate 10 are covered with the insulating films 17. The wires 13 formed over the upper surface 10*t* of the wiring substrate 10 are covered with the insulating film 17. In the insulating film 17, openings are formed and, in the openings, at least portions (bonding regions) of the plurality of bonding pads 16 are exposed from the insulating film 17. On the other hand, the wires 13 formed over the lower surface 10*b* of the wiring substrate 10 are covered with the insulating film 17. In the insulating film 17, openings are formed and, in the openings, at least portions (portions bonded to the solder balls 11) of the plurality of lands 12 are exposed from the insulating film 17.

Also, as shown in FIG. 3, the semiconductor device PKG1 has the interposer 20A mounted over the wiring substrate 10. The interposer 20A is mounted over the upper surface 10*t* of the wiring substrate 10 such that the lower surface 20*b* faces the upper surface 10*t* of the wiring substrate 10. The interposer 20A is an interposer substrate interposed between the plurality of semiconductor chips 30 and the wiring substrate 10. The interposer 20A according to Embodiment 1 is the interposer substrate including wiring paths which electrically couple the plurality of semiconductor chips 30 to each other. In other words, the interposer 20A according to Embodiment 1 has the function of electrically coupling the plurality of semiconductor chips 30 to the wiring substrate 10 and the function of electrically coupling the plurality of semiconductor chips 30 mounted over the interposer 20A to each other.

Also, as shown in FIG. 7, the interposer 20A is a so-called multi-layer wiring substrate including a plurality of stacked wiring layers. In the example shown in FIG. 7, the interposer 20A includes the total of eight wiring layers which are wiring layers M1, M2, M3, M4, M5, M6, M7, and M8 located in this order with increasing distance from the upper surface 20*t*. Each of the plurality of wiring layers has a plurality conductor patterns of wires 22 or the like. The conductor patterns adjacent to each other are covered with insulating layers 21. However, the number of the wiring layers included in the interposer 20A is not limited to that in the example shown in FIG. 7 and may be, e.g., smaller or larger than eight.

In the example shown in FIG. 7, the interposer 20A has a structure in which a core layer (core material, core insulating layer, or insulating layer) 21*c* is used as a base material and the plurality of wiring layers are stacked over each of the upper and lower surfaces of the core layer 21*c*. The core layer 21*c* is an insulating layer serving as the base material of the interposer 20A and made of an insulating material obtained by impregnating a fibrous material such as, e.g., glass fiber with a resin material such as an epoxy resin.

In the example shown in FIG. 7, over the upper surface of the core layer 21c, the wiring layers M1, M2, M3, and M4 are formed and, over the lower surface of the core layer 21c, the wiring layers M5, M6, M7, and M8 are formed. The wiring layers M2, M3, and M4 formed over the upper surface of the core layer 21c have respective portions functioning as the transmission paths electrically coupling the logic chip 30B to the memory chip 30A. The respective portions of the wiring layers M2, M3, and M4 which form the foregoing transmission paths are hereinafter referred to as lead-out wires 22C.

The wires 22 made of the wiring layers M2, M3, and M4 include power supply wires, GND (ground potential) wires, and signal wires. These wires 22 form a so-called coplanar structure in which the wires 22 are disposed in the same plane in, e.g., each of the wiring layers M2, M3, and M4.

The respective insulating layers 21 stacked over the upper and lower surfaces of the core layer 21c are made of an organic insulating material such as, e.g., a thermosetting resin. The insulating layers 21 may also be formed of a glass material (inorganic insulating material) such as, e.g., silicon dioxide ($SiO_2$). When the insulating layers 21 are formed of an inorganic insulating material, it is possible to improve the planarity of each of the insulating layers 21 serving as an underlie for each of the wiring layers. This allows the wire widths of the plurality of wires 22 to be reduced and allows the placement density of the plurality of wires 22 to be higher than the placement density of the wires 13 of the wiring substrate 10. The plurality of wiring layers stacked over the upper and lower surfaces of the core layer 21c are formed by, e.g., a build-up method.

The plurality of wiring layers included in the interposer 20A are electrically coupled to each other through via wires 23 and through hole wires 24 each serving as an interlayer conductive path. Specifically, the core layer 21c includes an upper surface 21t and a lower surface 21b located opposite to the upper surface 21t. The core layer 21c also has a plurality of through holes extending from one of the upper and lower surfaces 21t and 21b to the other and the plurality of through hole wires 24 formed by embedding a conductor in the plurality of through holes. Each of the plurality of through hole wires 24 serves as the interlayer conductive path which electrically couples the wiring layer M4 provided over the upper surface 21t of the core layer 21c to the wiring layer M5 provided over the lower surface 21b of the core layer 21c.

The wiring layers M1, M2, M3, and M4 stacked over the upper surface 21t of the core layer 21c are electrically coupled to each other through the plurality of via wires 23. The wiring layers M5, M6, M7, and M8 stacked over the lower surface 21b of the core layer 21c are electrically coupled to each other through the plurality of via wires 23.

Note that, within the limits that allow the interposer 20A to retain its own shape, in a modification of the layout of the wiring layers included in the interposer 20A, the number of the wiring layers stacked over the upper surface 21t of the core layer 21c may be different from the number of the wiring layers stacked over the lower surface 21b of the core layer 21c. For example, when the number of the wiring layers stacked over the upper surface 21t of the core layer 21c is larger than the number of the wiring layers stacked over the lower surface 21b of the core layer 21c, it is possible to increase the number of the wiring layers in the wiring paths in which the intervening through hole wires 24 are absent and also reduce the thickness of the interposer 20A.

For example, the via wires 23 are formed as follows, the details of which will be described later. First, after the insulating layer 21 is provided so as to cover the underlying wiring layer, openings are provided in portions of the insulating layer 21 to expose portions of the underlying wiring layer. Then, a conductor is embedded in the openings to form the via wires 23. Subsequently, the via wires 23 are formed, and then another wiring layer is stacked over the via wires 23, which electrically couples the upper wiring layer to the lower wiring layer.

Over the upper surface 20t of the interposer 20A, a plurality of upper-surface terminals (terminals, bonding pads, lands, or component coupling terminals) 25 made of the uppermost wiring layer M1 are formed. The plurality of upper-surface terminals 25 are electrically coupled individually to electrodes (surface electrodes, component electrodes, or pads) 33 of the semiconductor chips 30 via bump electrodes 35 made of, e.g., a solder.

The upper-surface terminals 25 include power supply terminals, GND (ground potential) terminals, and signal terminals.

In the example shown in FIG. 7, the via wires 23 coupled to the upper-surface terminals 25 are formed immediately under the upper-surface terminals 25 (at positions overlapping the upper-surface terminals 25 in the thickness direction). In this case, there is no need for a space for coupling the via wires 23 to the upper-surface terminals 25. As a result, it is possible to increase the placement density of the plurality of upper-surface terminals 25. However, in a modification of FIG. 7, it may also be possible to form lead-out wires (the illustration thereof is omitted) to be coupled to the upper-surface terminals 25 in the wiring layer M1 for the purpose of coupling the upper-surface terminals 25 to the via wires 23 and couple the via wires 23 to the upper-surface terminals 25 via the lead-out wires. In this case, the placement density of the plurality of upper-surface terminals 25 decreases compared to that in the example shown in FIG. 7, but the processibility of the upper-surface terminals 25 is improved. This allows an improvement in the accuracy with which the upper-surface terminals 25 are processed.

Note that, in the example shown in Embodiment 1, ball-shaped electrodes made of a solder are used as the bump electrodes 35 shown in FIG. 7. However, the structure of each of the bump electrodes 35 has various modifications. For example, it may also be possible to use a pillar bump (columnar bump) in which a solder film is formed over the tip end surface of a conductor pillar made of copper (Cu) or nickel (Ni) as the bump electrode 35.

On the other hand, over the lower surface 20b of the interposer 20A, a plurality of lower-surface terminals (terminals, solder coupling pads, lands, or wiring substrate coupling terminals) 26 made of the lowermost wiring layer M8 are formed. The plurality of lower-surface terminals 26 are electrically coupled individually to the plurality of bonding pads 16 of the wiring substrate 10 via bump electrodes 27 made of, e.g., a solder or the like.

In the example shown in FIG. 7, the via wires 23 coupled to the lower-surface terminals 26 are formed immediately over the lower-surface terminals 26 (at positions overlapping the lower-surface terminals 26 in the thickness direction). In this case, there is no need for a space for coupling the via wires 23 to the lower-surface terminals 26. As a result, it is possible to increase the placement density of the plurality of lower-surface terminals 26. For instance, in the example shown in FIG. 7, the surface area of each of the lower-surface terminals 26 is larger than the surface area of each of the upper-surface terminals 25. However, in a modification of FIG. 7, in the same manner as in the modification of the wiring layer M1 described above, it may also be possible to form lead-out wires (the illustration thereof is omitted) to be coupled to the lower-surface terminals 26 in the wiring layer M8 for the purpose of coupling the lower-surface terminals 26 to the via wires 23 and couple the via wires 23 to the lower-surface terminals 26 via the lead-out wires. In this case, the placement density of the plurality of lower-surface terminals 26 decreases compared to that in the example shown in FIG. 7, but the processibility of the lower-surface terminals 26 is improved. This allows an improvement in the accuracy with which the lower-surface terminals 26 are processed.

In the example shown in FIG. 7, each of the plurality of upper-surface terminals 25 and the plurality of lower-surface terminals 26 is uncovered with the insulating film and exposed from the insulating layer 21. However, in a modification FIG. 7, it may also be possible to provide an insulating film (solder resist film) covering the plurality of upper-surface terminals 25 and an insulating film (solder resist film) covering the plurality of lower-surface terminals 26. In this case, when openings are formed in the insulating films to expose respective portions of the plurality of upper-surface terminals 25 and the plurality of lower-surface terminals 26 from the insulating films, it is possible to couple the bump electrodes 35 to the upper-surface terminals 25 and couple the bump electrodes 27 to the lower-surface terminals 26.

Note that the interposer 20A has various modifications in addition to the modification of the number of the wiring layers described above. For example, in a modification of FIG. 7, a so-called coreless substrate not having the core layer 21c may also be used.

However, in the case of forming the wiring substrate including the plurality of wiring layers, in order to reduce the wire widths of the plurality of wires 22 and the spacings between the plurality of wires 22, it is necessary to improve the planarity of each of the wiring layers. In general, in the case of stacking wiring layers in accordance with a build-up method, as the number of the stacked wiring layers increases, it is more difficult to ensure the planarity of the upper wiring layer. Accordingly, such a method as used in Embodiment 1 in which the core layer 21c is provided and the wiring layers are stacked over each of the upper and lower surfaces 21t and 21b of the core layer 21c is preferred in terms of allowing an increase in the number of the wiring layers and an improvement in the planarity of each of the wiring layers.

As shown in FIG. 3, the semiconductor device PKG1 includes the plurality of semiconductor chips 30 mounted over the upper surface 20t of the interposer 20A. As shown in FIG. 7, each of the plurality of semiconductor chips 30 has a silicon substrate (base material) 31 having a main surface 31t and a wiring layer 32 disposed over the main surface 31t. Note that, in FIG. 7, for improved clarity of illustration, the single wiring layer 32 is shown but, in the wiring layer 32 shown in, e.g., FIG. 7, a plurality of wiring layers each having a thickness smaller than that of each of the wiring layers of the interposer 20A are stacked. Also, in each of the plurality of wiring layers 32, a plurality of wires are formed, though the illustration thereof is omitted for improved clarity of illustration. The plurality of wires are covered with an insulating layer which provides insulation between the plurality of wires and between the adjacent wires. The insulating layer is an inorganic insulating layer made of an oxide of a semiconductor material such as, e.g., silicon oxide (SiO).

In the main surface 31t of the silicon substrate 31 included in each of the plurality of semiconductor chips 30, a plurality of semiconductor elements such as, e.g., transistor elements or diode elements are formed. The plurality of semiconductor elements are electrically coupled to the plurality of electrodes (surface electrodes, component electrodes, or pads) 33 formed over the top surface 30t via the plurality of wires in the wiring layer 32.

In Embodiment 1, each of the plurality of semiconductor chips 30 is mounted over the upper surface 20t of the interposer 20A with the top surface 30t facing the upper surface 20t of the interposer 20A. Such a mounting method is referred to as a face-down mounting method or a flip-chip coupling method. In the flip-chip coupling method, the semiconductor chips 30 are electrically coupled to the interposer 20A as follows.

Over the wiring layer 32 of the semiconductor chip 30, the plurality of electrodes 33 are formed. The plurality of electrodes 33 have respective portions exposed from a passivation film 34 as a protective insulating film at the top surface 30t of the semiconductor chip 30. In some cases, the electrodes 33 are formed over the passivation as the protective insulating film. The electrodes 33 are electrically coupled to the upper-surface terminals 25 of the interposer 20A via the bump electrodes 35 coupled to the exposed portions of the electrodes 33.

Also, in Embodiment 1, as shown in FIG. 6, some of the plurality of transmission paths coupled to the memory chip 30A are not coupled to the wiring substrate 10, but are coupled to the logic chip 30B via the interposer 20A. In the example shown in FIG. 6, the data line DQ and the control signal line CMD are electrically disconnected from the wiring substrate 10. On the other hand, among the plurality of transmission paths coupled to the memory chip 30A, the power supply line VD2 which supplies the power supply potential for driving the circuit of the memory chip 30A and the reference potential line VS1 are electrically coupled to the wiring substrate 10.

<Details of Transmission Paths Mutually Electrically Coupling Semiconductor Chips>

<<Advantages of Interposer>>

Next, a description will be given of the details of the signal transmission paths electrically coupling the memory chip 30A to the logic chip 30B.

As an example of a SiP-type semiconductor device, there is a configuration in which the memory chip 30A and the logic chip 30B are mounted in a single package, as used in Embodiment 1. To improve the performance of a SiP-type semiconductor device with such a configuration, a technique which improves the transmission speed of each of the signal transmission paths coupling the memory chip 30A to the logic chip 30B is required. For example, each of a plurality of the data lines DQ, which are among the signal transmission paths shown in FIG. 6, is designed so as to transmit a data signal at a transmission speed of not less than 1 Gbps (1 gigabit per second). To increase the transmission speed of each of the plurality of signal transmission paths, it is necessary to increase the number of times transmission is performed per unit time (hereinafter referred to as higher clock speed).

As another method for improving the transmission speed between the memory chip 30A and the logic chip 30B, there is a method which increases the width of a data bus in the internal interface to increase the amount of data transmitted at a time (hereinafter referred to as larger bus width). There is also a method which uses the larger bus width and the higher clock speed each described above in combination. In this case, a large number of high-speed signal transmission paths are required.

For example, when a memory referred to as a HBM (High Bandwidth Memory) is used for the memory chip 30A shown in FIG. 6, the data bus width is not less than 1024 bits. In addition, the number of times transmission is performed per unit time at each of the terminals is increased to achieve a higher clock speed so that a transfer rate per terminal is, e.g., not less than 1 Gbps.

Thus, in the case where there are a large number of signal transmission paths which electrically couple the plurality of semiconductor chips 30 to each other, when all the signal transmission paths are routed using only the wiring substrate 10 without providing the interposer 20A over the wiring substrate 10, the wiring structure of the wiring substrate 10 is complicated. For example, the case is considered in which the number of the wiring layers of the wiring substrate 10 exceeds 30. Accordingly, when there are a large number of signal transmission paths which electrically couple the plurality of semiconductor chips 30 to each other, a method is effective in which the interposer 20A is provided in addition to the wiring substrate to couple the signal paths to each other via the wiring layers formed in the interposer 20A.

Specifically, as used in Embodiment 1, a method which electrically couples the memory chip 30A to the logic chip 30B via the interposer 20A is effective. In this case, since the number of the signal transmission paths provided in the wiring substrate 10 can be reduced, the structure of the wiring substrate 10 can be simplified. When a consideration is given to the number of the wiring layers in the entire semiconductor device PKG1, it is possible to reduce the number of the wiring layers (the number of the wiring layers in the wiring substrate 10 and the number of the wiring layers in the interposer 20A) can be reduced.

<<Problem of Interposer>>

However, when it is required to further increase the number of the signal transmission paths between the memory chip 30A and the logic chip 30B, it is necessary to place a large number of transmission paths at a high density in the interposer 20A. As an example of a method for satisfying the requirement described above, there is a method which increases the number of the wiring layers formed in the interposer 20A. However, when the number of the wiring layer is increased, the cost of the interposer 20A increases to consequently increase the cost of the semiconductor device. As another example of the method for satisfying the requirement described above, there is a method which reduces the respective widths of the plurality of wires provided in each of the wiring layers and thus increases the wire density in each of the wiring layers or the number of lead-out wires. However, the width of each of the plurality of wires is, e.g., about 2 µm in the case of a silicon interposer or a glass interposer and is, e.g., about 5 µm in the case of an interposer using a glass epoxy substrate. In the current state, it is still difficult to provide a stable miniaturization technique which allows a further width reduction.

Accordingly, the present inventors have examined a technique which allows a large number of signal transmission paths to be placed at a high density in the interposer 20A without increasing the number of the wiring layers and changing layout rules and found the configuration of the interposer 20A according to Embodiment 1.

The following is a detailed description of a configuration of the wiring layers functioning as signal transmission paths which electrically couple the plurality of semiconductor chips to each other according to Embodiment 1.

Note that, the following description will be given using the configuration of the interposer 20A shown in FIG. 7 as an example. That is, in the example shown in FIG. 7, respective portions of the wiring layers M2, M3, and M4 formed over the upper surface of the core layer 21c form the lead-out wires 22C functioning as the signal transmission paths electrically coupling the memory chip 30A to the logic chip 30B.

<<Structure of Interposer in Comparative Example>>

First, using FIGS. 8, 9, and 10, a description will be given of a configuration of individual wiring layers provided in an interposer comparatively examined by the present inventors, which may conceivably define the configuration of the individual wiring layers provided in the interposer according to Embodiment 1.

Figure 8:
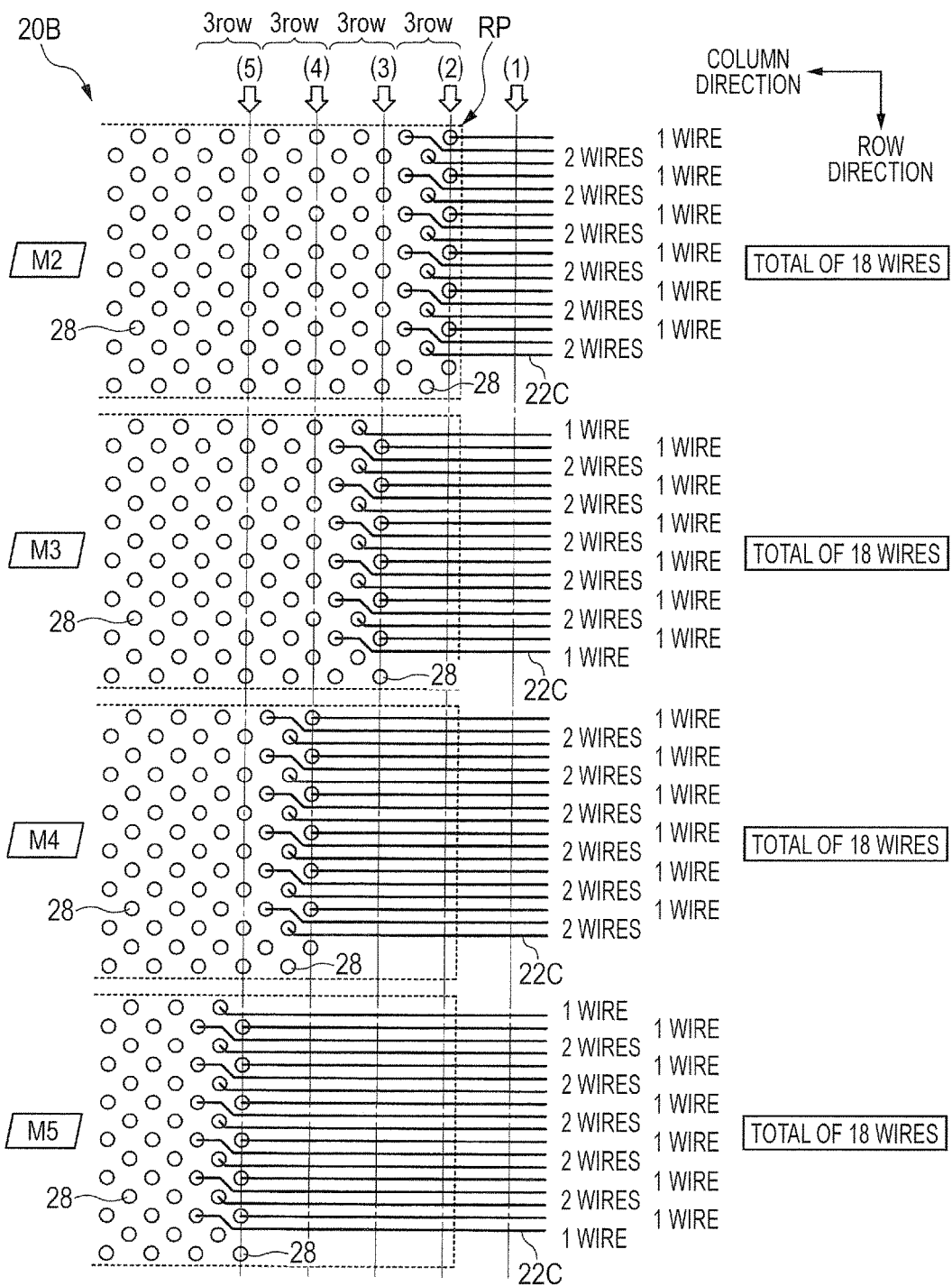
FIG. 8 is a plan view showing a layout of respective portions of the individual wiring layers included in an interposer according to a comparative example.

FIG. 8 is a plan view showing a layout of respective portions of the individual wiring layers included in the interposer according to the comparative example. FIG. 9 shows cross-sectional views of the interposer according to the comparative example, which are along the lines (1), (2), (3), (4), and (5) shown by the arrows in FIG. 8. FIG. 10 is a table showing an example of layout rules for the individual wiring layers included in the interposer.

Note that the main difference between the interposer according to Embodiment 1 and the interposer according to the comparative example is in the configuration of the signal transmission paths which electrically couple the memory chip 30A to the logic chip 30B. Accordingly, the other components will be described using those of the interposer 20A according to Embodiment 1 as an example.

FIG. 8 shows an example of the layout of the individual wiring layers which are among the wiring layers electrically coupling the memory chip 30A to the logic chip 30B and which form the signal transmission paths in the region where the memory chip 30A is mounted. The layout of the individual wiring layers forming the signal transmission paths in the region where the logic chip 30B is mounted may also be the same as the layout of the individual wiring layers forming the signal transmission paths in the region where the memory chip 30A is mounted, though a description thereof is omitted herein. Alternatively, it is also possible to apply the layout example according to Embodiment 1 only to the layout of the individual wiring layers forming the signal transmission paths in the region where the logic chip 30B is mounted.

By way of example, FIG. 8 shows the four wiring layers which are the wiring layers M2, M3, M4, and M5 stacked in this order with increasing distance from the upper surface 20t of an interposer 20B between the upper surface 20t and the upper surface 21t of the core layer 21c. Note that, in FIG. 8, the plurality of upper-surface terminals 25 made of the uppermost wiring layer M1 formed over the upper surface 20t of the interposer 20B is omitted. However, the plurality of upper-surface terminals 25 are arranged in substantially the same layout as that of, e.g., via lands 28 made of the wiring layer M2 shown in FIG. 8.

In the example shown in FIG. 8, for the signal transmission paths electrically coupling the memory chip 30A to the logic chip 30B, the plurality of lead-out wires 22C made of the wiring layers M2, M3, M4, and M5 are used. The uppermost wiring layer M1 formed over the upper surface 20t of the interposer 20B is included only in the plurality of upper-surface terminals 25 and is not used for the lead-out wires 22C.

For example, when it is sufficient to use only the wiring layer M2 to allow the required signal transmission paths to be provided, the lead-out wires 22C made of the wiring layers M3, M4, and M5 are unnecessary. However, to improve the performance of the semiconductor device, a technique which increases the number of data items that can be transmitted between the memory chip 30A and the logic chip 30B is required. To meet the requirement, it is important to increase the number of data items that can be transmitted at a time by increasing the number of the wiring layers each having the plurality of signal transmission paths and increase the number of data items that can be transmitted by increasing the number of times transmission is performed per unit time.

Figure 9:
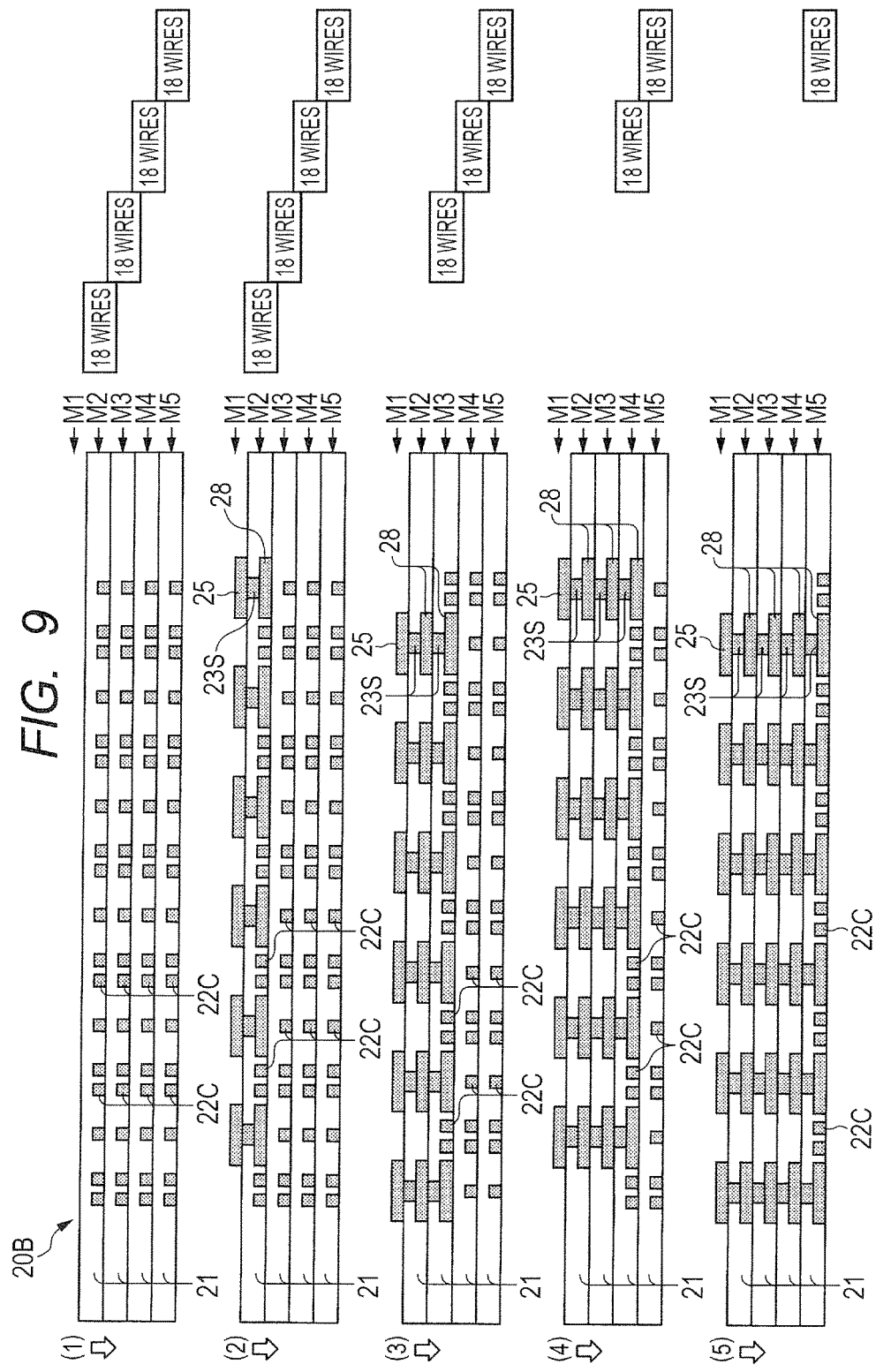
FIG. 9 shows cross-sectional views of the interposer according to the comparative example, which are along the lines (1), (2), (3), (4), and (5) shown by the arrows in FIG. 8.

As shown in FIGS. 8 and 9, in the interposer 20B using a build-up substrate, every time a wiring layer is stacked, short via wires 23S are stacked over the via lands 28 to achieve through coupling between the upper and lower wiring layers. The via lands 28 function also as stoppers when openings are provided in portions of the insulating layer 21 which provides electrical insulation between the plurality of wiring layers by processing such as laser processing or the like so as to form the via wires 23.

In the plurality of wiring layers, the lead-out wires 22C, the via wires 23, and the via lands 28 are formed. The via lands 28 in the upper wiring layer are electrically coupled to the via lands 28 in the lower wiring layer by the via wires 23.

When the via wires 23 are formed, openings are formed using a laser or the like in portions of the insulating layer 21 formed so as to cover the lower wiring layer. However, unless the openings are formed in each of the wiring layers under the same conditions (optimum opening conditions based on the material of the insulating layer, the sizes of the openings, the thickness of the insulating layer, the depths of the openings, and the like), the openings may not be able to be formed stably or defective openings due to, e.g., smear resulting from an insulating material remaining in the openings or the like may be formed. In the interposer using the build-up substrate, there are many cases where the thicknesses of the wiring layers and the thicknesses of the insulating layers are varied from layer to layer. By forming the openings under optimum processing conditions, the via wires 23 are formed.

In the following description, the position where the chip end portion (side surface 30s shown in FIG. 3) of the memory chip 30A which faces the logic chip 30B overlaps the interposer 20B in plan view is assumed to be a reference position RP, and the row of the via wires 23 and the via lands 28 which is located at the position closest to the reference position RP along the reference position RP is assumed to the 1st row. The rows equidistantly arranged in succession in the direction from the reference position RP toward the inside of the memory chip 30A are hereinafter assumed to be the 2nd, 3rd, and subsequent rows.

Accordingly, the plurality of lead-out wires 22C extend from the via lands 28 provided in each of the rows (1st, 2nd, 3rd, and subsequent rows) in each of the plurality of wiring layers toward the logic chip 30B so as to traverse the reference position RP.

According to the set values of the layout rules shown in FIG. 10, since the minimum pitch (Min pitch) is 55 μm, it follows that the plurality of via wires 23 and the plurality of via lands 28 can be arranged at a 55 μm pitch in the row direction. In this case, when the diameter (Land) of each of the via lands 28 is, e.g., 30 μm, the spacing (Land-Land space) between the via lands 28 adjacent to each other in the row direction is 25 μm. Accordingly, when the width of each of the wires is 5 μm, the number of the lead-out wires 22C that can be placed between the adjacent via lands 28 is two.

In the example shown in FIG. 8, in the wiring layer M2, the plurality of via lands 28 are arranged at the minimum pitch in the 1st row closest to the reference position RP. The plurality of via lands 28 in the 1st row are coupled individually to the lead-out wires 22C extending in the direction toward the logic chip 30B.

In the 1st row, between the two via lands 28 adjacent to each other in the row direction, the two lead-out wires are allowed to extend. One of the two lead-out wires 22C has one end coupled to the via land 28 disposed in the 2nd row, while the other of the two lead-out wires 22C has one end coupled to the via land 28 disposed in the 3rd row. This allows the two lead-out wires 22C to be electrically coupled to the logic chip 30B.

Accordingly, in the example shown in FIG. 8, in the wiring layer M2, the lead-out wires 22C can be placed using the plurality of via lands 28 in the three rows (3 row) counted from the reference position RP. For example, in the six columns (6×minimum pitch), the total of 18 lead-out wires 22C can be placed.

As shown in FIGS. 8 and 9, under the via lands 28 made of the wiring layer M2 and coupled to the lead-out wires 22C, neither the via wires 23 nor the via lands 28 are formed, and the lead-out wires 22C each made of the wiring layer M3, M4, or M5 extend via the insulating layer 21.

To each of the wiring layers M3, M4, and M5, what applies to the wiring layer M2 also applies.

That is, in the wiring layer M3, in the 4th row closer to the reference position RP, the plurality of via lands 28 are arranged at the minimum pitch. The plurality of via lands 28 in the 4th row are coupled individually to the lead-out wires 22C.

In the 4th row, between the two via lands 28 adjacent to each other in the row direction, the two lead-out wires 22C are allowed to extend. One of the two lead-out wires 22C has one end coupled to the via land 28 disposed in the 5th row, while the other of the two lead-out wires 22C has one end coupled to the via land 28 disposed in the 6th row. This allows the two lead-out wires 22C to be electrically coupled to the logic chip 30B.

In the wiring layer M4, in the 7th row closer to the reference position PR, the plurality of via lands 28 are arranged at the minimum pitch. The plurality of via lands 28 in the 7th row are coupled individually to the lead-out wires 22C.

In the 7th row, between the two via lands 28 adjacent to each other in the row direction, the two lead-out wires 22C are allowed to extend. One of the two lead-out wires 22C has one end coupled to the via land 28 disposed in the 8th row, while the other of the two lead-out wires 22C has one end coupled to the via land 28 disposed in the 9th row. This allows the two lead-out wires 22C to be electrically coupled to the logic chip 30B.

In the wiring layer M5, in the 10th row closer to the reference position PR, the plurality of via lands 28 are arranged at the minimum pitch. The plurality of via lands 28 in the 10th row are coupled individually to the lead-out wires 22C.

In the 10th row, between the two via lands 28 adjacent to each other in the row direction, the two lead-out wires 22C are allowed to extend. One of the two lead-out wires 22C has one end coupled to the via land 28 disposed in the 11th row, while the other of the two lead-out wires 22C has one end coupled to the via land 28 disposed in the 12th row. This allows the two lead-out wires 22C to be electrically coupled to the logic chip 30B.

Accordingly, in each of the wiring layers M3, M4, and M5 also, in the same manner as in the wiring layer M2, the lead-out wires 22C can be placed using the plurality of via lands 28 in the three rows (3 row) counted from the reference position RP. Accordingly, in each of the wiring layers M3, M4, and M5 also, the total of 18 lead-out wires 22C can be placed in, e.g., the six columns (6×minimum pitch).

Thus, the interposer 20B according to the comparative example uses the plurality of via lands 28 formed in the individual wiring layers and disposed in the three rows (3 row) counted from the reference position RP and individually couples the plurality of lead-out wires 22C electrically coupling the memory chip 30A to the logic chip 30B to the plurality of via lands 28.

Accordingly, in the interposer 20B according to the comparative example, when it is required to increase the number of the signal transmission paths between the memory chip 30A and the logic chip 30B under the same design rules, it is possible to respond to the requirement by increasing the number of the wiring layers. However, as described above, when the number of the wiring layers is increased, a problem arises in that the cost of the interposer 20B increases to consequently increase the cost of the semiconductor device.

<<Structure of Interposer in Embodiment 1>>

Next, using FIGS. 11A, 11B, 12, and 13, a description will be given of a configuration of the individual wiring layers provided in the interposer 20A according to Embodiment 1.

Figure 11A:
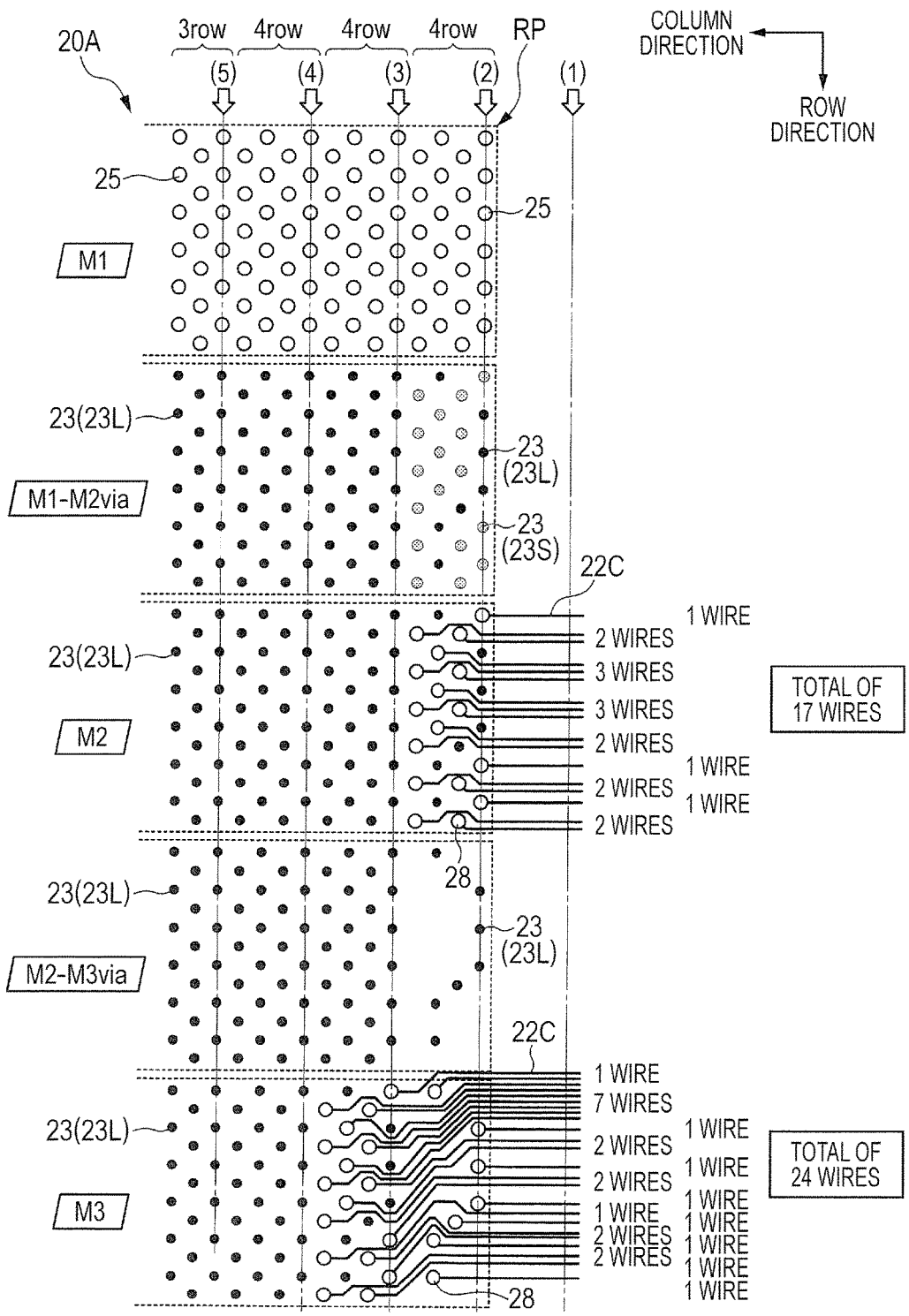
FIG. 11A is a plan view showing a layout of respective portions of the individual wiring layers and via wires which are included in the interposer according to Embodiment 1.
Figure 11B:
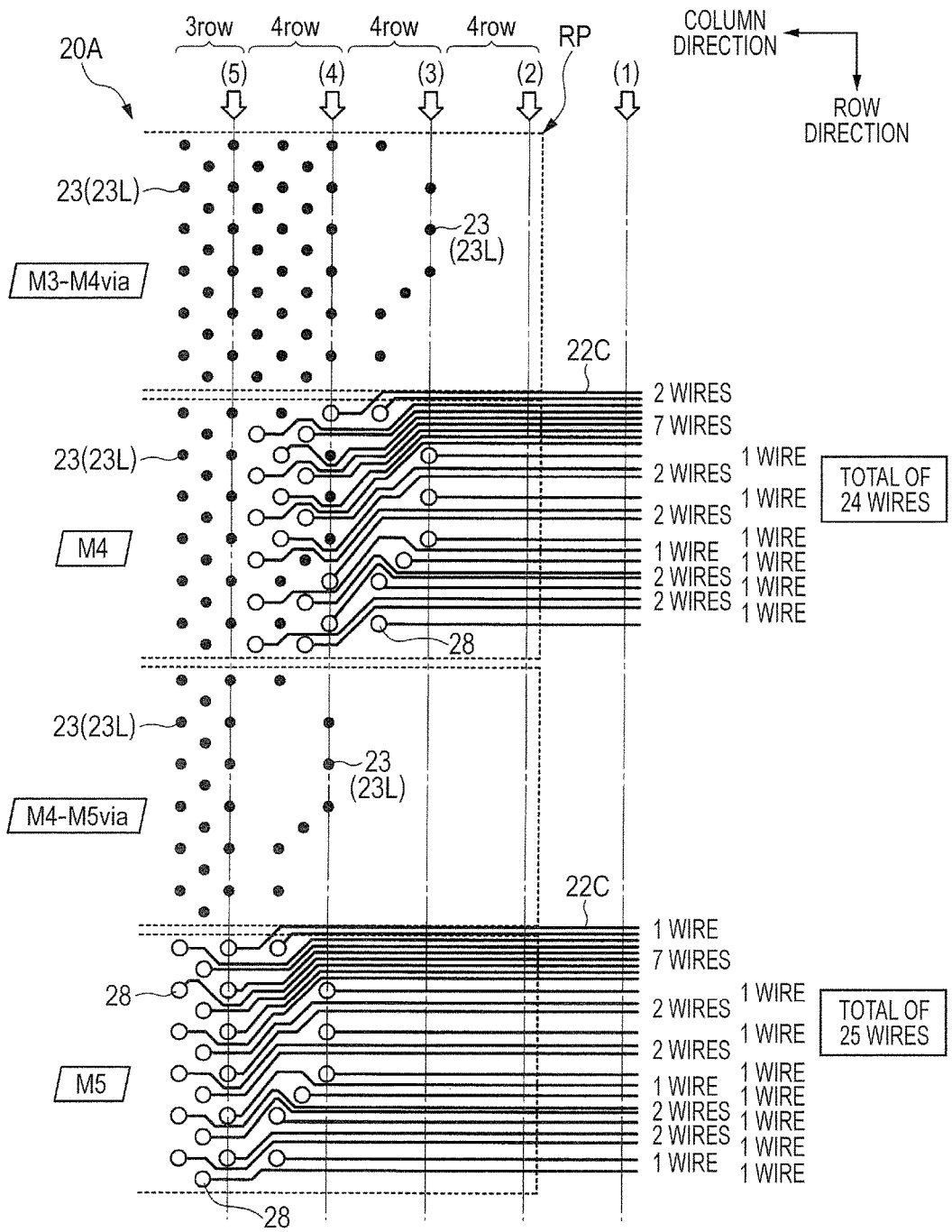
FIG. 11B is a plan view showing a layout of respective portions of the individual wiring layers and via wires which are included in the interposer according to Embodiment 1.
Figure 12:
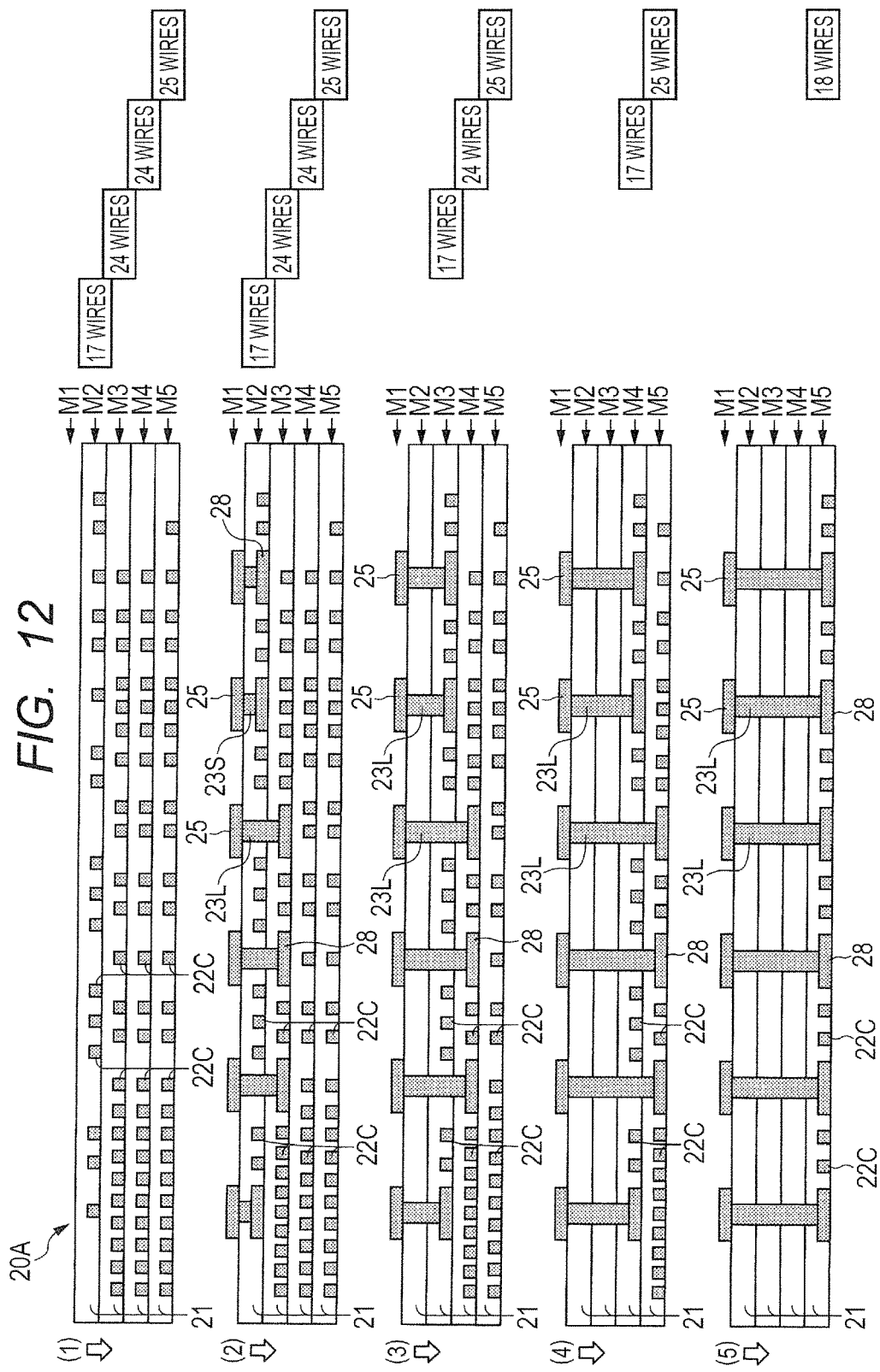
FIG. 12 shows cross-sectional views of the interposer according to Embodiment 1, which are along the lines (1), (2), (3), (4), and (5) shown by the arrows in FIGS. 11A and 11B.
Figure 13:
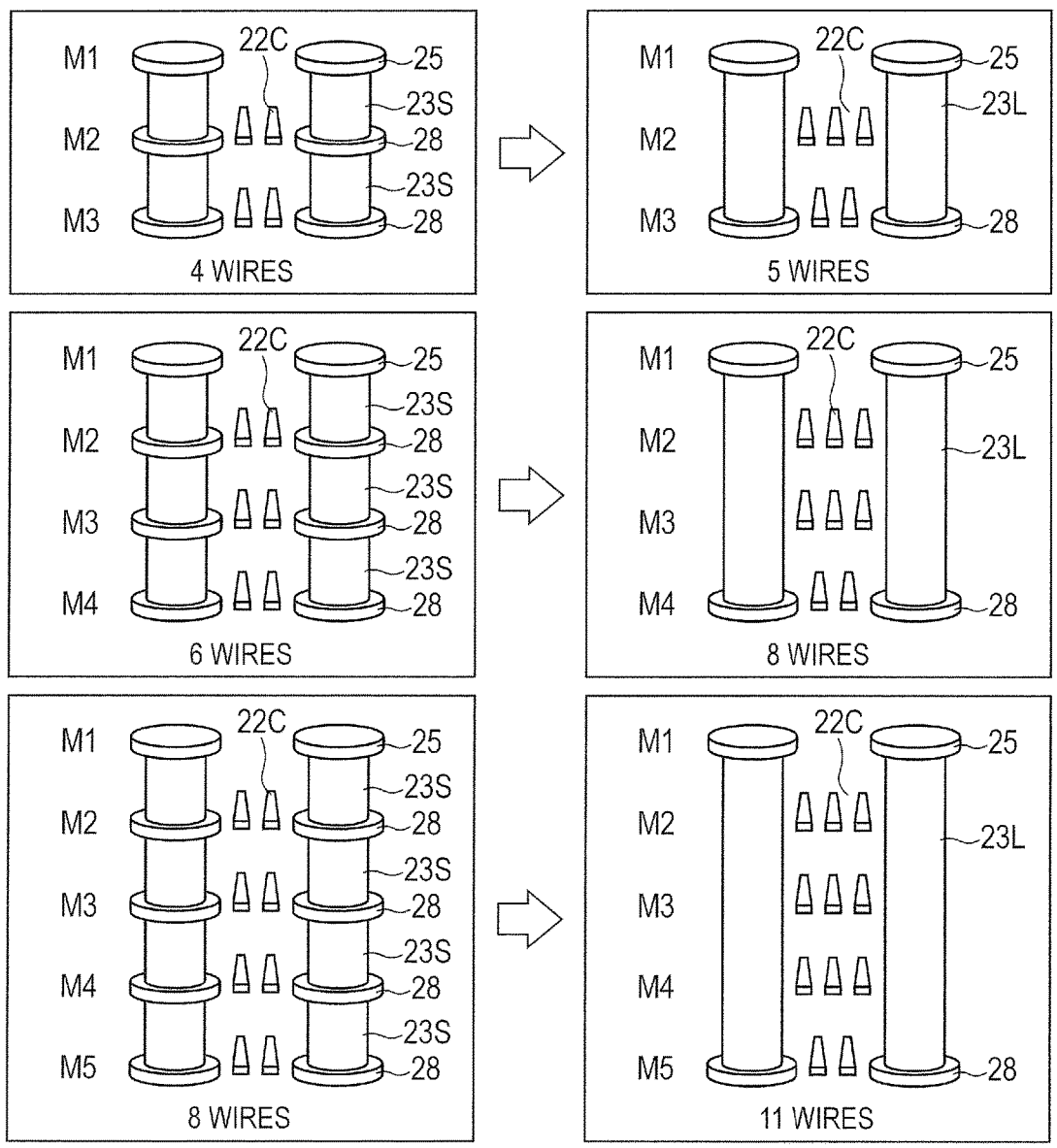
FIG. 13 is a cross-sectional view schematically showing a structure of via wires and via lands which are included in the interposer according to the comparative example and a structure of via wires and via lands which are included in the interposer according to Embodiment 1.

FIGS. 11A and 11B are plan views each showing a layout of respective portions of the individual wiring layers and the via wires which are included in the interposer according to Embodiment 1. FIG. 12 shows cross-sectional views of the interposer according to Embodiment 1, which are along the lines (1), (2), (3), (4), and (5) shown by the arrows in FIGS. 11A and 11B. FIG. 13 is a cross-sectional view schematically showing a structure of the via wires and the via lands which are included in the interposer according to the comparative example and a structure of the via wires and the via lands which are included in the interposer according to Embodiment 1.

FIGS. 11A and 11B show an example of the layout of the individual wiring layers which are among the wiring layers electrically coupling the memory chip 30A to the logic chip 30B and which form the signal transmission paths in the region where the memory chip 30A is mounted. The layout of the individual wiring layers forming the signal transmission paths in the region where the logic chip 30B is mounted may also be the same as the layout of the individual wiring layers forming the signal transmission paths in the region where the memory chip 30A is mounted, though a description thereof is omitted herein. Alternatively, it is also possible to apply the layout example according to Embodiment 1 only to the layout of the individual wiring layers forming the signal transmission paths in the region where the logic chip 30B is mounted.

By way of example, FIGS. 11A and 11B show the five wiring layers which are the wiring layers M1, M2, M3, M4, and M5 stacked in this order with increasing distance from the upper surface 20t of the interposer 20A between the upper surface 20t and the upper surface 21t of the core layer 21c (see FIG. 7) as well as the via wires 23 (short via wires 23S and long via wires 23L) coupling the individual wiring layers to each other. The short via wires 23S are shown by the dotted circles, while the long via wires 23L are shown by the solid circles. FIG. 11A shows the layout of the wiring layer M1, the via wires 23 between the wiring layers M1 and M2, the wiring layer M2, the via wires 23 between the wiring layers M2 and M3, and the wiring layer M3. FIG. 11B shows the layout of the via wires 23 between the wiring layers M3 and M4, the wiring layer M4, the via wires 23 between the wiring layers M4 and M5, and the wiring layer M5.

In the example shown in FIGS. 11A and 11B, for the signal transmission paths electrically coupling the memory chip 30A to the logic chip 30B, the plurality of lead-out wires 22C made of the wiring layers M2, M3, M4, and M5 are used. The uppermost wiring layer M1 formed over the upper surface 20t of the interposer 20A is included only in the plurality of upper-surface terminals 25 and is not used for the lead-out wires 22C.

For example, when it is sufficient to use only the wiring layer M2 to allow the required signal transmission paths to be provided, the lead-out wires 22C made of the wiring layers M3, M4, and M5 is unnecessary. However, to improve the performance of the semiconductor device, a technique which increases the number of data items that can be transmitted between the memory chip 30A and the logic chip 30B is required. To meet the requirement, it is important to increase the number of data items that can be transmitted at a time by increasing the number of the wiring layers each having the plurality of signal transmission paths and increase the number of data items that can be transmitted by increasing the number of times transmission is performed per unit time.

As shown in FIGS. 11A, 11B, and 12, in the interposer 20A using the build-up substrate, the plurality of wiring layers, i.e., the wiring layers M2, M3, M4, and M5 are stacked between the upper surface 21t of the core layer 21c and the upper surface 20t of the interposer 20A (see FIG. 7). In addition, the insulating layers 21 which provide electrical insulation between the plurality of wiring layers are formed. In each of the insulating layers 21, the plurality of via wires 23 for electrically coupling the upper wiring layer to the lower wiring layer are formed (see FIG. 7).

In the interposer 20A, as shown in the interposer 20B according to the comparative example, every time a wiring layer is stacked, the via wires 23 are stacked on the via lands 28 to achieve through coupling between the upper and lower wiring layers. In addition, the interposer 20A has the via wires 23 which extend from the wiring layer M1 (upper-surface terminals 25) to achieve direct through coupling between the wiring layer M1 and the wiring layer M3, M4, or M5 without intervention of the via lands 28. That is, the plurality of via wires 23 include the via wire 23 which directly couples the wiring layer M1 to the wiring layer M3 without intervention of the via land 28 made of the wiring layer M2, the via wire 23 which directly couples the wiring layer M1 to the wiring layer M4 without intervention of the via land 28 made of the wiring layers M2 and M3, and the via wire 23 which directly couples the wiring layer M1 to the wiring layer M5 without intervention of the via land 28 made of the wiring layers M2, M3, and M4. As a result, in each of the wiring layers, the plurality of via lands 28 coupled to the lead-out wires 22C are not arranged at the same pitch in a staggered array configuration.

The following will specifically describe a configuration of the via wires 23, the via lands 28, and the lead-out wires 22C in the interposer 20A according to Embodiment 1.

In the following description, the position where the chip end portion (side surface 30s shown in FIG. 3) of the memory chip 30A which faces the logic chip 30B overlaps the interposer 20A in plan view is assumed to be the reference position RP, and the row of the via wires 23 which is located at the position closest to the reference position RP along the reference position RP is assumed to be the 1st row. The rows equidistantly arranged in succession in the direction from the reference position RP toward the inside of the memory chip 30A are hereinafter assumed to be the 2nd, 3rd, and subsequent rows.

Accordingly, the plurality of lead-out wires 22C extend from the via lands 28 provided in each of the rows (1st, 2nd, 3rd, and subsequent rows) in each of the plurality of wiring layers toward the logic chip 30B so as to traverse the reference position RP.

According to the set values of the layout rules shown in FIG. 10, since the minimum pitch (Min pitch) is 55 µm, it follows that the plurality of via wires 23 and the plurality of via lands 28 can be arranged at a 55 µm pitch in the row direction.

[About Wiring Layer M2]

In the example of the wiring layer M2 shown in FIGS. 11A and 12, in the 1st row closest to the reference position RP, the three via wires (hereinafter referred to as short via wires) 23S coupling the wiring layer M1 (upper-surface terminals 25) to the wiring layer M2 are arranged in the row direction, and the three via wires (hereinafter referred to as long via wires) 23L coupling the wiring layer M1 (upper-surface terminals 25) to the wiring layer M3 are arranged in the row direction. That is, the three short via wires 23S and the three long via wires 23L are alternately arranged in the row direction. The short via wires 23S and the long via wires 23L are arranged at the minimum pitch in the row direction.

In the portions of the wiring layer M2 which are coupled to the short via wires 23S, the via lands 28 made of the wiring layer M2 are formed. In the portions of the wiring layer M3 which are coupled to the long via wires 23L, the via lands 28 made of the wiring layer M3 are formed.

The plurality of via lands 28 made of the wiring layer M2 in the 1st row are coupled individually to the lead-out wires 22C extending in the direction toward the logic chip 30B.

According to the set values of the layout rules shown in FIG. 10, since the spacing between one of the via lands 28 and the long via wire 23L which are adjacent to each other in the row direction in the 1st row is 30 µm, the two lead-out wires 22C made of the wiring layer M2 are allowed to extend therebetween. One of the two lead-out wires 22C between the via land 28 and the long via wire 23L has one end coupled to the via land 28 disposed in the 2nd row, while the other of the two lead-out wires 22C has one end coupled to the via land 28 disposed in the 4th row. On the other hand, one of the two lead-out wires 22C between another one of the via lands 28 and the long via wire 23L which are adjacent to each other in the 1st row has one end coupled to the via land 28 disposed in the 3rd row, while the other of the two lead-out wires 22C has one end coupled to the via land 28 disposed in the 4th row.

Since the spacing between the two long via wires 23L which are adjacent to each other in the row direction in the 1st row is 35 µm, the three lead-out wires 22C made of the wiring layer M2 are allowed to extend therebetween. One of the three lead-out wires 22C has one end coupled to the via land 28 disposed in the 2nd row. Another one of the three lead-out wires 22C has one end coupled to the via land 28 disposed in the 3rd row. The remaining one of the three lead-out wires 22C has one end coupled to the via land 28 disposed in the 4th row.

Since the spacing between the two via lands 28 which are adjacent to each other in the row direction in the 1st row is 25 µm, the two lead-out wires 22C made of the wiring layer M2 are allowed to extend therebetween. One of the two lead-out wires 22C has one end coupled to the via land 28 disposed in the 2nd row, while the other of the two lead-out wires 22C has one end coupled to the via land 28 disposed in the 4th row.

This allows the plurality of via lands 28 arranged in the 1st to 4th rows to be electrically coupled to the logic chip 30B via the lead-out wires 22C.

Accordingly, in the wiring layer M2, the lead-out wires 22C can be placed using the plurality of via lands 28 in the four rows (4 row) counted from the reference position RP. For example, in the six columns (6×minimum pitch), the total of 17 lead-out wires 22C can be placed.

As shown in FIGS. 11A and 12, under the via lands 28 made of the wiring layer M2 and coupled to the lead-out wires 22C, neither the via wires 23 nor the via lands 28 are formed, and the lead-out wires 22C made of the wiring layer M3, M4, or M5 extend via the insulating layer 21.

[About Wiring Layer M3]

In the example of the wiring layer M3 shown in FIGS. 11A, 11B, and 12, in each of the 1st, 2nd, and 3rd rows, the via lands 28 coupled to the wiring layer M1 (upper-surface terminals 25) via the long via wires 23L are disposed. These via lands 28 are coupled individually to the lead-out wires 22C extending in the direction toward the logic chip 30B. In the 4th row, the via lands 28 are not disposed.

In the 5th row, the three long via wires 23L coupling the wiring layer M1 (upper-surface terminals 25) to the wiring layer M3 are arranged in the row direction. Also, in the 5th row, the three long via wires 23L coupling the wiring layer M1 (upper-surface terminals 25) to the wiring layer M4 are arranged in the row direction. That is, the three long via wires 23L between the wiring layers M1 and M3 and the long via wires 23L between the wiring layers M1 and M4 are alternately arranged in the row direction. The plurality of long via wires 23L are arranged at the minimum pitch in the row direction.

In the portions of the wiring layer M3 which are coupled to the long via wires 23L between the wiring layers M1 and M3, the via lands 28 made of the wiring layer M3 are formed. In the portions of the wiring layer M4 which are coupled to the long via wires 23L between the wiring layers M1 and M4, the via lands 28 made of the wiring layer M4 are formed.

The plurality of via lands 28 made of the wiring layer M3 in the 5th row are coupled individually to the lead-out wires 22C extending in the direction toward the logic chip 30B.

According to the set values of the layout rules shown in FIG. 10, since the spacing between one of the via lands 28 and the long via wire 23L which are adjacent to each other in the row direction in the 5th row is 30 µm, the two lead-out wires 22C made of the wiring layer M3 are allowed to extend therebetween. One of the two lead-out wires 22C between the via land 28 and the long via wire 23L has one end coupled to the via land 28 disposed in the 6th row, while the other of the two lead-out wires 22C has one end coupled to the via land 28 disposed in the 8th row. On the other hand, one of the two lead-out wires 22C between another one of the via lands 28 and the long via wire 23L which are adjacent to each other in the 5th row has one end coupled to the via land 28 disposed in the 7th row, while the other of the two lead-out wires 22C has one end coupled to the via land 28 disposed in the 8th row.

Since the spacing between the two long via wires 23L which are adjacent to each other in the row direction in the 5th row is 35 µm, the three lead-out wires 22C made of the wiring layer M3 are allowed to extend therebetween. One of the three lead-out wires 22C has one end coupled to the via land 28 disposed in the 6th row. Another one of the three lead-out wires 22C has one end coupled to the via land 28 disposed in the 7th row. The remaining one of the three lead-out wires 22C has one end coupled to the via land 28 disposed in the 8th row.

Since the spacing between the two via lands 28 which are adjacent to each other in the row direction in the 5th row is 25 μm, the two lead-out wires 22C made of the wiring layer M3 are allowed to extend therebetween. One of the two lead-out wires 22C has one end coupled to the via land 28 disposed in the 6th row, while the other of the two lead-out wires 22C has one end coupled to the via land 28 disposed in the 8th row.

This allows the plurality of via lands 28 arranged in the 5th to 8th rows to be electrically coupled to the logic chip 30B via the lead-out wires 22C.

Accordingly, in the wiring layer M3, the lead-out wires 22C can be placed using the plurality of via lands 28 in the eight rows (8 row) counted from the reference position RP. For example, in the six columns (6×minimum pitch), the total of 24 lead-out wires 22C can be placed.

As shown in FIGS. 11A, 11B, and 12, under the via lands 28 made of the wiring layer M3 and coupled to the lead-out wires 22C, neither the via wires 23 nor the via lands 28 are formed, and the lead-out wires 22C made of the wiring layer M4 or M5 extend via the insulating layer 21.

[About Wiring Layer M4]

In the example of the wiring layer M4 shown in FIGS. 11A, 11B, and 12, in each of the 5th, 6th, and 7th rows, the via lands 28 coupled to the wiring layer M1 (upper-surface terminals 25) via the long via wires 23L are disposed. These via lands 28 are coupled individually to the lead-out wires 22C extending in the direction toward the logic chip 30B. In the 8th row, the via lands 28 are not disposed.

In the 9th row, the three long via wires 23L coupling the wiring layer M1 (upper-surface terminals) to the wiring layer M4 are arranged in the row direction. Also, in the 9th row, the three long via wires 23L coupling the wiring layer M1 (upper-surface terminals 25) to the wiring layer M5 are arranged in the row direction. That is, the three long via wires 23L between the wiring layers M1 and M4 and the three long via wires 23L between the wiring layers M1 and M5 are alternately arranged in the row direction. The plurality of long via wires 23L are arranged at the minimum pitch in the row direction.

In the portions of the wiring layer M4 which are coupled to the long via wires 23L between the wiring layers M1 and M4, the via lands 28 made of the wiring layer M4 are formed. In the portions of the wiring layer M5 which are coupled to the long via wires 23L between the wiring layers M1 and M5, the via lands 28 made of the wiring layer M5 are formed.

The plurality of via lands 28 made of the wiring layer M4 in the 9th row are coupled individually to the lead-out wires 22C extending in the direction toward the logic chip 30B.

According to the set values of the layout rules shown in FIG. 10, since the spacing between one of the via lands 28 and the long via wire 23L which are adjacent to each other in the row direction in the 9th row is 30 μm, the two lead-out wires 22C made of the wiring layer M4 are allowed to extend therebetween. One of the two lead-out wires 22C between the via land 28 and the long via wire 23L has one end coupled to the via land 28 disposed in the 10th row, while the other of the two lead-out wires 22C has one end coupled to the via land 28 disposed in the 12th row. On the other hand, one of the two lead-out wires 22C between another one of the via lands 28 and the long via wire 23L which are adjacent to each other in the 9th row has one end coupled to the via land disposed in the 11th row, while the other of the two lead-out wires 22C has one end coupled to the via land 28 disposed in the 12th row.

Since the spacing between the two long via wires 23L which are adjacent to each other in the row direction in the 9th row is 35 μm, the three lead-out wires 22C made of the wiring layer M4 are allowed to extend therebetween. One of the three lead-out wires 22C has one end coupled to the via land 28 disposed in the 10th row. Another one of the three lead-out wires 22C has one end coupled to the via land 28 disposed in the 11th row. The remaining one of the three lead-out wires 22C has one end coupled to the via land 28 disposed in the 12th row.

Since the spacing between the two via lands 28 which are adjacent to each other in the row direction in the 9th row is 25 μm, the two lead-out wires 22C made of the wiring layer M4 are allowed to extend therebetween. One of the two lead-out wires 22C has one end coupled to the via land 28 disposed in the 10th row, while the other of the two lead-out wires 22C has one end coupled to the via land 28 disposed in the 12th row.

This allows the plurality of via lands 28 arranged in the 9th to 12th rows to be electrically coupled to the logic chip 30B via the lead-out wires 22C.

Accordingly, in the wiring layer M4, the lead-out wires 22C can be placed using the plurality of via lands 28 in the eight rows (8 row) counted from the reference position RP. For example, in the six columns (6×minimum pitch), the total of 24 lead-out wires 22C can be placed.

As shown in FIGS. 11A, 11B, and 12, under the via lands 28 made of the wiring layer M4 and coupled to the lead-out wires 22C, neither the via wires 23 nor the via lands 28 are formed, and the lead-out wires 22C made of the wiring layer M5 extend.

[About Wiring Layer M5]

In the example of the wiring layer M5 shown in FIGS. 11A, 11B, and 12, in each of the 9th, 10th, and 11th rows, the via lands 28 coupled to the wiring layer M1 (upper-surface terminals 25) via the long via wires 23L are disposed. These via lands 28 are coupled individually to the lead-out wires 22C extending in the direction toward the logic chip 30B. In the 12th row, the via lands 28 are not disposed.

In each of the 13th, 14th, and 15th rows, the plurality of via lands 28 made of the wiring layer M5 are arranged at the minimum pitch in a staggered matrix configuration.

In the 13th row, the plurality of long via wires 23L coupling the wiring layer M1 (upper-surface terminals 25) to the wiring layer M5 are arranged at the minimum pitch in the row direction. In each of the 14th and 15th rows also, the plurality of long via wires 23L coupling the wiring layer M1 (upper-surface terminals 25) to the wiring layer M5 are arranged at the minimum pitch in the row direction.

In the portions of the wiring layer M5 which are coupled to the long via wires 23L, the via lands 28 made of the wiring layer M5 are formed.

The plurality of via lands 28 made of the wiring layer M5 in the 13th, 14th, and 15th rows are coupled individually to the lead-out wires 22C extending in the direction toward the logic chip 30B.

According to the set values of the layout rules shown in FIG. 10, since the spacing between the two via lands 28 which are adjacent to each other in the row direction in the 13th row is 25 μm, the two lead-out wires 22C are allowed to extend therebetween. One of the two lead-out wires 22C has one end coupled to the via land 28 disposed in the 14th row, while the other of the two lead-out wires 22C has one end coupled to the via land 28 disposed in the 15th row.

This allows the plurality of via lands 28 arranged in the 13th to 15th rows to be electrically coupled to the logic chip 30B via the lead-out wires 22C.

Accordingly, in the wiring layer M5, the lead-out wires 22C can be placed using the via lands 28 disposed in the seven rows (7 row) counted from the reference position RP. For example, in the six columns (6×minimum pitch), the total of 25 lead-out wires 22C can be placed.

The plurality of upper-surface terminals 25 formed over the upper surface 20t of the interposer 20A and made of the wiring layer M1 include the power supply terminals, the GND (ground potential) terminals, and the signal terminals. In the regions where the upper-surface terminals 25 electrically coupled to the lead-out wires 22C made of the wiring layers M2, M3, M4, and M5 are disposed, the power supply terminals and the GND terminals are not disposed. Accordingly, in Embodiment 1, the upper-surface terminals 25 disposed in the 1st to 15th rows counted from the reference position RP are used neither as the power supply terminals nor as the GND terminals. This is for the purpose of minimizing the lengths of the plurality of lead-out wires 22C electrically coupling the memory chip 30A to the logic chip 30 and maintaining a high transmission speed. For example, when the upper-surface terminals 25 functioning as the power supply terminals and the GND terminals are disposed in a region closer to the reference position RP, in the region where the upper-surface terminals 25 are disposed, the plurality of lead-out wires 22C which electrically couple the memory chip 30A to the logic chip 30B can no longer be formed. As a result, the lead-out wires 22C should be led out of a region away from the reference position RP, resulting in the longer lead-out wires 22C.

<<Effects Achieved by Interposer in Embodiment 1>>

As described above, in Embodiment 1, instead of forming the via lands 28 made of the wiring layers M2, M3, and M4 between the uppermost wiring layer M1 and the lowermost wiring layer M5, the respective long via wires 23L coupling the wiring layer M1 (upper-surface terminals 25) to the wiring layer M3, coupling the wiring layer M1 (upper-surface terminals 25) to the wiring layer M4, and coupling the wiring layer M1 (upper-surface terminals 25) to the wiring layer M5 are formed. In other words, in the interposer 20A, the plurality of via wires 23 at different depth are formed.

The spacing between the adjacent long via wires 23L spaced apart by a minimum distance in the row direction or in a diagonal direction between the rows is larger than the spacing between the adjacent via lands 28 spaced apart by a minimum distance in the row direction or in a diagonal direction between the rows. This allows the number of the lead-out wires 22C that can be placed between the adjacent long via wires 23C spaced apart by the minimum distance in the row direction or in a diagonal direction between the rows to be larger than the number of the lead-out wires 22C that can be placed between the adjacent via lands 28 spaced apart by the minimum distance in the row direction or in a diagonal direction between the rows.

In the direction from the reference position RP of the interposer 20A toward the inside of the memory chip 30A, the respective long via wires 23L coupling the wiring layer M1 (upper-surface terminals 25) to the wiring layer M3, coupling the wiring layer M1 (upper-surface terminals 25) to the wiring layer M4, and coupling the wiring layer M1 (upper-surface terminals 25) to the wiring layer M5 are arranged in this order. This allows the lead-out wires 22C made of the wiring layer M3 to be placed under the wiring layer M2, allows the lead-out wires 22C made of the wiring layer M4 to be placed under the wiring layers M2 and M3, and allows the lead-out wires 22C made of the wiring layer M5 to be placed under the wiring layers M2, M3, and M4.

According to the set values of the layout rules shown in FIG. 10, between the adjacent via lands 28 arranged at the minimum pitch in the row direction, the two lead-out wires 22C can be placed, as shown in FIG. 13. For instance, in the example (interposer 20B according to the comparative example) shown in FIGS. 8 and 9, in the six columns (6×minimum pitch), the 72 (18+18+18+18) lead-out wires 22C can be placed using the wiring layers M2, M3, M4, and M5.

However, according to the set values of the layout rules shown in FIG. 10, between the adjacent long via wires 23L arranged at the minimum pitch in the row direction, the three lead-out wires 22C can be placed, as shown in FIG. 13. For instance, in the example (interposer 20A according to Embodiment 1) shown in FIGS. 11A, 11B, and 12, in the six columns (6×minimum pitch), the 90 (17+24+24+25) lead-out wires 22C can be placed using the wiring layers M2, M3, M4, and M5.

Thus, in Embodiment 1, by increasing the number of the lead-out wires 22C made of the individual wiring layers, the number of the signal transmission paths between the memory chip 30A and the logic chip 30B can be increased without increasing the number of the wiring layers. As a result, it is possible to provide the interposer 20A having a high transmission speed at low cost.

Note that, in Embodiment 1, the respective long via wires 23L coupling the wiring layer M1 (upper-surface terminals 25) to the wiring layer M3, coupling the wiring layer M1 (upper-surface terminals 25) to the wiring layer M4, and coupling the wiring layer M1 (upper-surface terminals 25) to the wiring layer M5 are formed. However, the wiring layers coupled to each other by the long via wires 23L are not limited thereto. For example, it is possible to form the long via wire 23L coupling the wiring layers M2 and M5 to each other. It is also possible to couple the wiring layer M1 (upper-surface terminals 25) to the wiring layer M3 using the long via wire 23L and couple the wiring layers M3 and M5 to each other using the long wire 23L at the same position. In this case, in plan view, the two long via wires 23L overlap each other. It is also possible to couple the wiring layer M1 (upper-surface terminals 25) to the wiring layer M2 using the short via wire 23S and couple the wiring layers M3 and M5 to each other using the long via wire 23L at the same position. In this case, in plan view, the short via wire 23S and the long via wire 23L overlap each other.

Also, in Embodiment 1, when the short via wires 23S are formed, using a laser or the like, openings are formed in portions of the insulating layer 21 formed so as to cover the lower wiring layer. By controlling the depths and sizes of the openings using optimum processing conditions, the openings can stably be formed.

<<Method of Manufacturing Interposer>>

Figure 14A:
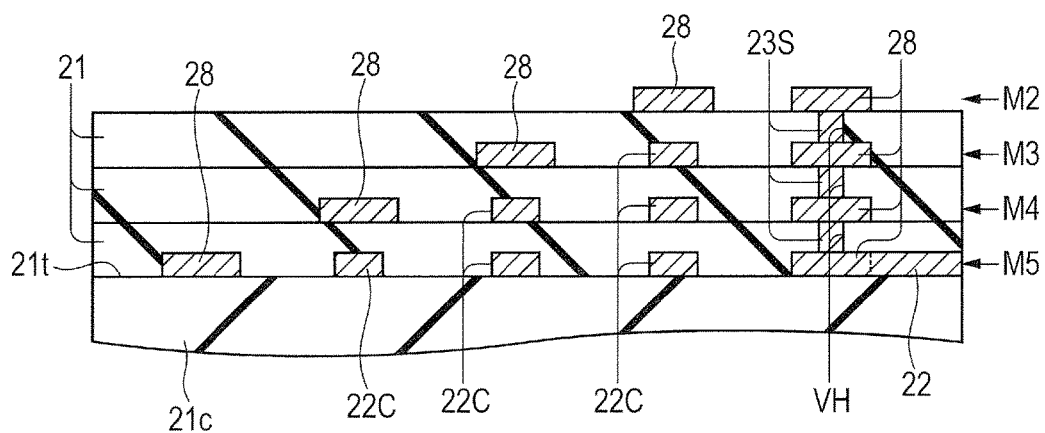
FIGS. 14A and 14B are cross-sectional views illustrating the manufacturing process of the interposer according to Embodiment 1.
Figure 14B:
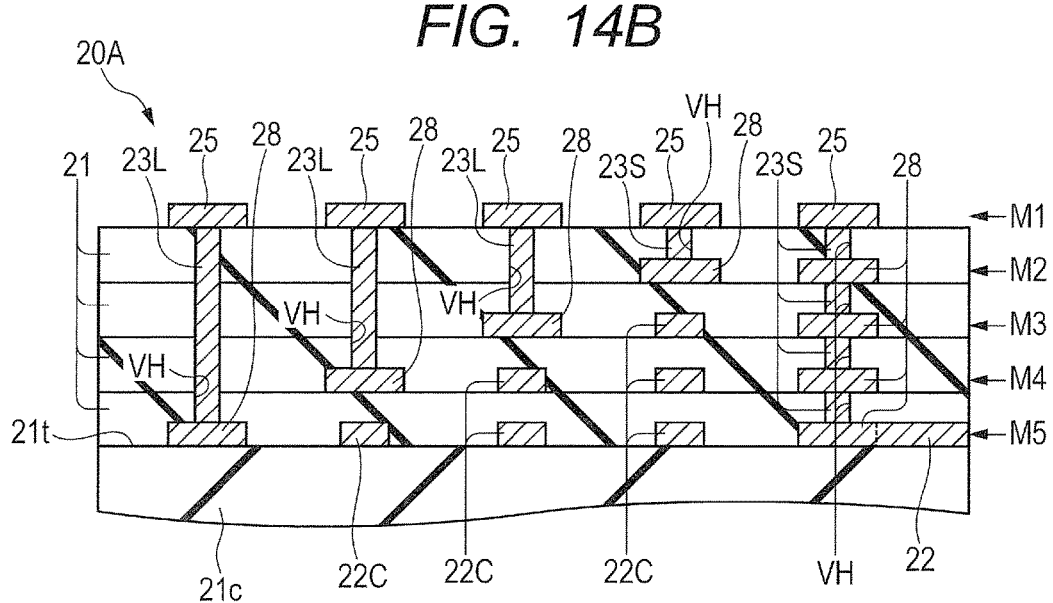

Next, using FIGS. 14A and 14B, a description will be given of an example of a method of manufacturing the interposer. FIGS. 14A and 14B are cross-sectional views illustrating the manufacturing process of the interposer according to Embodiment 1. A description will be given herein of a method of manufacturing the plurality of wiring layers stacked over the upper surface of the core layer and the via wires.

First, as shown in FIG. 14A, over the upper surface 21t of the core layer 21c serving as the base material, a plurality of conductor patterns made of the wiring layer M5, e.g., the via lands 28 and the wires 22 (lead-out wires 22C) are formed. Subsequently, the insulating layer 21 is deposited to cover the wiring layer M5. The insulating layer 21 is made of an organic insulating material such as, e.g., a thermosetting resin or a glass material (inorganic insulating material) such as silicon dioxide ($SiO_2$).

Next, using a laser, via holes VH are opened in the insulating layer 21 to reach the via lands 28. At this time, the via lands 28 function as a stopper film which controls the depths of the via holes VH. Subsequently, the via holes VH are filled with, e.g., copper plating. Then, by removing the unneeded conductor film from over the insulting layer 21, the short via wires 23S are formed.

Likewise, a plurality of conductor patterns made of the wiring layer M4 electrically coupled to the short via wires 23S, e.g., the via lands 28 and the wires 22 (lead-out wires 22C) are formed. Subsequently, the deposition of the insulating film 21, the opening of the via holes VH, and the filling of the via holes VH is performed.

Likewise, a plurality of conductor patterns made of the wiring layer M3 electrically coupled to the short via wires 23S, e.g., the via lands 28 and the wires 22 (lead-out wires 22C) are formed. Subsequently, the deposition of the insulating film 21, the opening of the via holes VH, and the filling of the via holes VH is performed.

Likewise, a plurality of conductor patterns made of the wiring layer M2 electrically coupled to the short via wires 23S, e.g., the via lands 28 and the wires (illustration thereof is omitted) are formed.

Next, as shown in FIG. 14B, the insulating layer 21 is deposited to cover the wiring layer M2. Next, using a laser, the via holes VH are opened in the insulating layer 21 covering the wiring layer M2 to reach the via lands 28 each made of the wiring layer M2, M3, M4, or M5. At this time, the via lands 28 each made of the wiring layer M2, M3, M4, or M5 function as a stopper film which controls the depths of the via holes VH. Since the conductor patterns (via lands 28) made of the individual wiring layers function as the stopper film, the via holes VH each reaching the wiring layer M2, M3, M4, or M5 can be formed at different depths.

Next, by filling the via holes VH with, e.g., copper plating, the short via wires 23S and the long via wires 23L are formed. Subsequently, a plurality of conductor patterns made of the wiring layer M1 electrically coupled to the short via wire 23S or the long via wire 23L, e.g., the upper-surface terminals 25 are formed. By the foregoing manufacturing process, the interposer 20A according to Embodiment 1 is generally completed.

Note that the method of manufacturing the interposer 20A is not limited thereto. For example, in Embodiment 1, each of the wiring layers and the via wires 23 are formed in different manufacturing process steps. However, each of the wiring layers can also be formed integrally with the via wires 23.

(Embodiment 2)

Embodiment 1 described above uses the interposer using, as the base material, the insulating material obtained by impregnating a fibrous material such as glass fiber with a resin material such as an epoxy resin. By contrast, Embodiment 2 uses a so-called silicon interposer using, as a base material, a semiconductor substrate made of silicon (Si) or the like and having a plurality of wiring layers stacked over a main surface of the semiconductor substrate.

<Details of Transmission Paths Mutually Electrically Coupling Semiconductor Chips>

<<Structure of Silicon Interposer in Comparative Example>>

First, using FIGS. 15, 16, and 17, a description will be given of a configuration of individual wiring layers provided in a silicon interposer comparatively examined by the present inventors, which may conceivably define the configuration of the individual wiring layers provided in the silicon interposer according to Embodiment 2.

Figure 15:
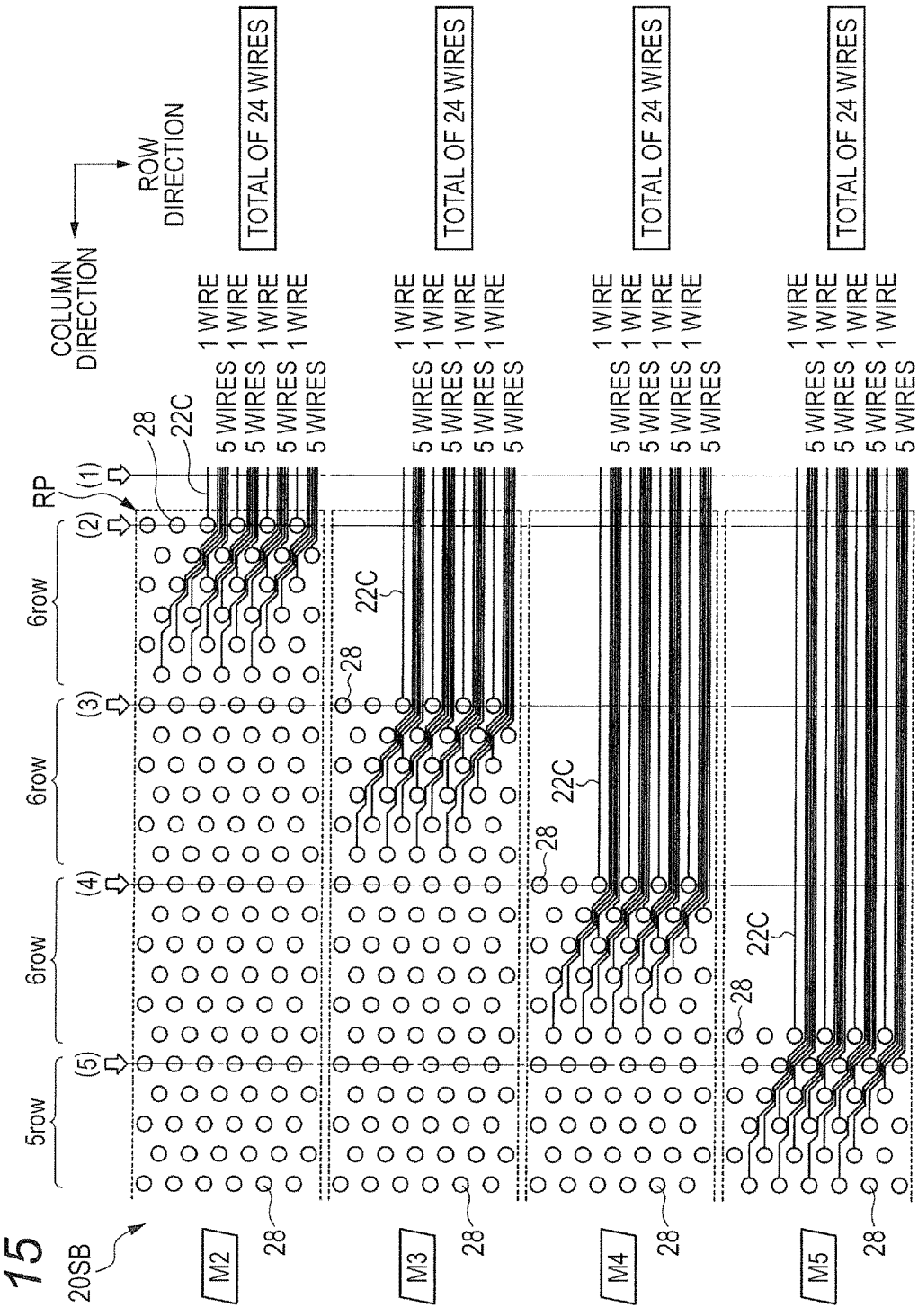
FIG. 15 is a plan view showing a layout of respective portions of the individual wiring layers included in a silicon interposer according to a comparative example.

FIG. 15 is a plan view showing a layout of respective portions of the individual wiring layers included in the silicon interposer according to a comparative example. FIG. 16 shows cross-sectional views of the silicon interposer according to the comparative example, which are along the lines (1), (2), (3), (4), and (5) shown by the arrows in FIG. 15. FIG. 17 is a table showing an example of layout rules for the individual wiring layers included in the silicon interposer.

Note that the main difference between Embodiment 2 and Embodiment 1 described above is in the structure of the interposer. Accordingly, the components other than the interposer will be described using those of the interposer 20A according to Embodiment 1 described above as an example.

FIG. 15 shows an example of the layout of the individual wiring layers which are among the wiring layers electrically coupling the memory chip 30A to the logic chip 30B and which form the signal transmission paths in the region where the memory chip 30A is mounted. The layout of the individual wiring layers forming the signal transmission paths in the region where the logic chip 30B is mounted may be or may not be the same as the layout of the individual wiring layers forming the signal transmission paths in the region where the memory chip 30A is mounted, though a description thereof is omitted herein. Alternatively, it is also possible to apply the layout example according to Embodiment 2 only to the layout of the individual wiring layers forming the signal transmission paths in the region where the logic chip 30B is mounted.

By way of example, FIG. 15 shows the four wiring layers which are the wiring layers M2, M3, M4, and M5 stacked in this order with increasing distance from the upper surface 20t of a silicon interposer 20SB between the upper surface 20t and the upper surface 21t of the core layer 21c using silicon (Si) as a main material. Note that, in FIG. 15, the plurality of upper-surface terminals 25 made of the uppermost wiring layer M1 formed over the upper surface 20t of the silicon interposer 20SB is omitted. However, the plurality of upper-surface terminals 25 are arranged in substantially the same layout as that of, e.g., the via lands 28 made of the wiring layer M2 shown in FIG. 15.

In the example shown in FIG. 15, for the signal transmission paths electrically coupling the memory chip 30A to the logic chip 30B, the plurality of lead-out wires 22C made of the wiring layers M2, M3, M4, and M5 are used. The uppermost wiring layer M1 formed over the upper surface 20t of the silicon interposer 20SB is included only in the plurality of upper-surface terminals 25 and is not used for the lead-out wires 22C.

For example, when it is sufficient to use only the wiring layer M2 to allow the required signal transmission paths to be provided, the lead-out wires 22C made of the wiring layers M3, M4, and M5 are unnecessary. However, to improve the performance of the semiconductor device, a technique which increases the number of data items that can be transmitted between the memory chip 30A and the logic chip 30B is required. To meet the requirement, it is important to increase the number of data items that can be transmitted at a time by increasing the number of the wiring layers each having the plurality of signal transmission paths and increase the number of data items that can be transmitted by increasing the number of times transmission is performed per unit time.

Figure 16:
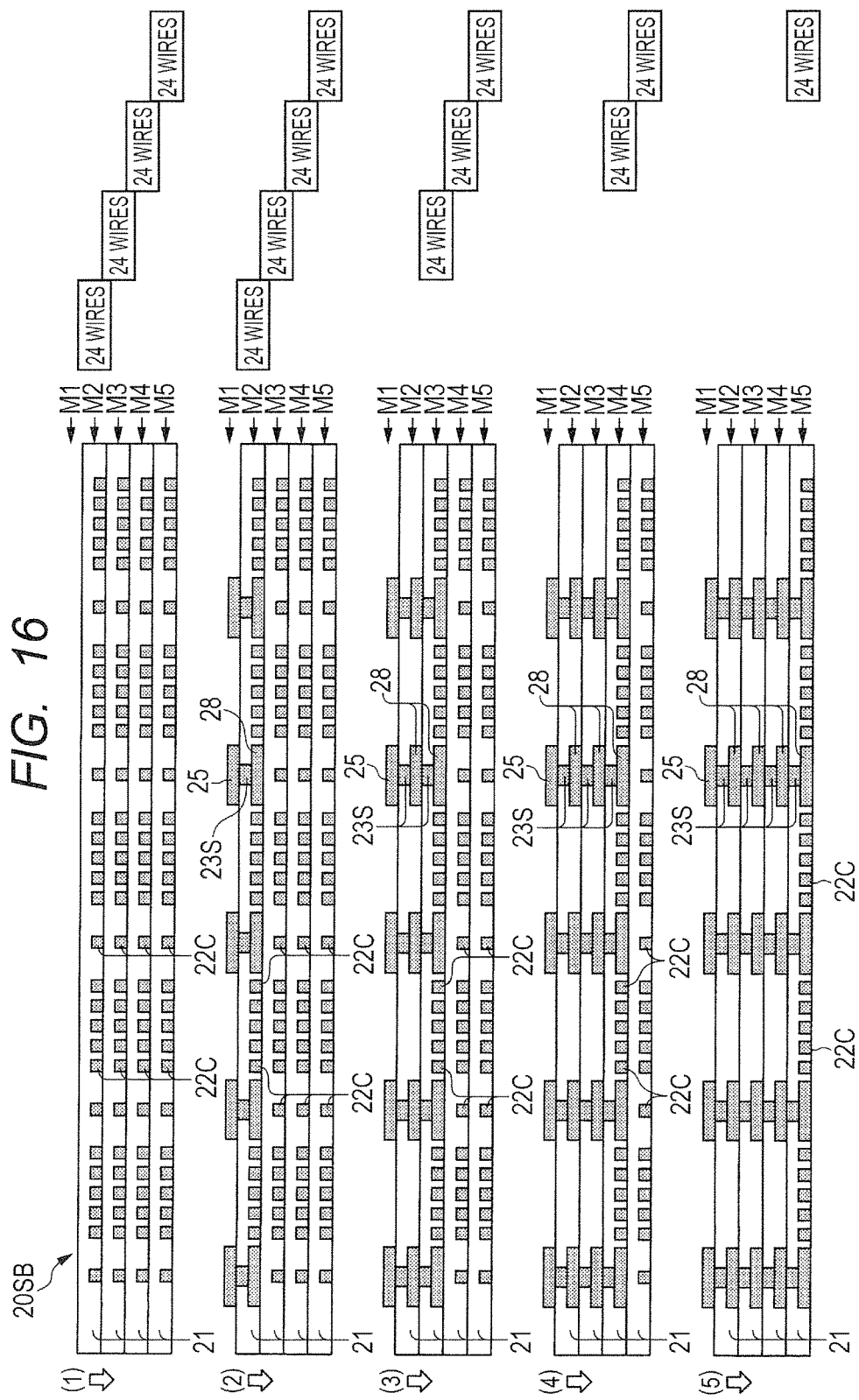
FIG. 16 shows cross-sectional views of the silicon interposer according to the comparative example, which are along the lines (1), (2), (3), (4), and (5) shown by the arrows in FIG. 15.

As shown in FIGS. 15 and 16, in the silicon interposer 20SB, every time a wiring layer is stacked, the via wires 23 are stacked over the via lands 28 to achieve through coupling between the upper and lower wiring layers. The via lands 28 function also as stoppers when openings are provided in portions of the insulating layer 21 which provides electrical insulation between the plurality of wiring layers by processing such as laser processing, wet etching, or dry etching so as to form the via wires 23.

In the plurality of wiring layers, the lead-out wires 22C, the via wires 23, and the via lands 28 are formed in the silicon interposer 20SB. The via lands 28 in the upper wiring layer are electrically coupled to the via lands 28 in the lower wiring layer by the via wires 23.

When the via wires 23 are formed, openings are formed by laser processing, wet etching, dry etching, or the like in portions of the insulating layer 21 formed so as to cover the lower wiring layer. The openings can stably be formed by controlling the depths and sizes of the openings using optimum processing conditions.

In the following description, the position where the chip end portion (side surface 30s shown in FIG. 3) of the memory chip 30A which faces the logic chip 30B in plan view overlaps the interposer 20B is assumed to be a reference position RP, and the row of the via wires 23 and the via lands 28 which is located at the position closest to the reference position RP along the reference position RP is assumed to be the 1st row. The rows equidistantly arranged in succession in the direction from the reference position RP toward the inside of the memory chip 30A are hereinafter assumed to be the 2nd, 3rd, and subsequent rows.

Accordingly, the plurality of lead-out wires 22C extend from the via lands 28 provided in each of the rows (1st, 2nd, 3rd, and subsequent rows) in each of the plurality of wiring layers toward the logic chip 30B so as to traverse the reference position RP.

According to the set values of the layout rules shown in FIG. 17, since the minimum pitch (Min pitch) is 55 μm, it follows that the plurality of via wires 23 and the plurality of via lands 28 can be arranged at a 55 μm pitch in the row direction. In this case, when the diameter (Land) of each of the via lands 28 is, e.g., 30 μm, the spacing (Land-Land space) between the via lands adjacent to each other in the row direction is 25 μm. Accordingly, when the width of each of the wires is 2 μm, the number of the lead-out wires 22C that can be placed between the adjacent via lands 28 is five.

In the example shown in FIG. 15, in the wiring layer M2, the plurality of via lands 28 are arranged at the minimum pitch in the 1st row closest to the reference position RP. The plurality of via lands 28 in the 1st row are coupled individually to the lead-out wires 22C extending in the direction toward the logic chip 30B.

In the 1st row, between the two via lands 28 adjacent to each other in the row direction, the five lead-out wires are allowed to extend. The 1st, 2nd, 3rd, 4th, and 5th lead-out wires 22C have respective one ends coupled to the respective via lands 28 disposed in the 2nd, 3rd, 4th, 5th, and 6th rows. This allows the five lead-out wires 22C to be electrically coupled to the logic chip 30B.

Accordingly, in the example shown in FIG. 15, in the wiring layer M2, the lead-out wires 22C can be placed using the via lands 28 in the six rows (6 row) counted from the reference position RP. For example, in the four columns (4×minimum pitch), the total of 24 lead-out wires 22C can be placed.

As shown in FIGS. 15 and 16, under the via lands 28 made of the wiring layer M2 and coupled to the lead-out wires 22C, neither the via wires 23 nor the via lands 28 are formed, and the lead-out wires each made of the wiring layer M3, M4, or M5 extend via the insulating layer 21.

To each of the wiring layers M3, M4, and M5, what applies to the wiring layer M1 also applies.

That is, in the wiring layer M3, in the 7th row closer to the reference position RP, the plurality of via lands 28 are arranged at the minimum pitch. The plurality of via lands 28 in the 7th row are coupled individually to the lead-out wires 22C.

In the 7th row, between the two via lands 28 adjacent to each other in the row direction, the five lead-out wires 22C are allowed to extend. The 1st, 2nd, 3rd, 4th, and 5th lead-out wires 22C have respective one ends coupled to the via lands 28 disposed in the 8th, 9th, 10th, 11th, and 12th rows. This allows the five lead-out wires 22C to be electrically coupled to the logic chip 30B.

In the wiring layer M4, in the 13th row closer to the reference position PR, the plurality of via lands 28 are arranged at the minimum pitch. The plurality of via lands 28 in the 13th row are coupled individually to the lead-out wires 22C.

In the 13th row, between the two via lands 28 adjacent to each other in the row direction, the five lead-out wires 22C are allowed to extend. The 1st, 2nd, 3rd, 4th, and 5th lead-out wires 22C have respective one ends coupled to the via lands 28 disposed in the 14th, 15th, 16th, 17th, and 18th rows. This allows the five lead-out wires 22C to be electrically coupled to the logic chip 30B.

In the wiring layer M5, in the 19th row closer to the reference position PR, the plurality of via lands 28 are arranged at the minimum pitch. The plurality of via lands 28 in the 19th row are coupled individually to the lead-out wires 22C.

In the 19th row, between the two via lands 28 adjacent to each other in the row direction, the five lead-out wires 22C are allowed to extend. The 1st, 2nd, 3rd, 4th, and 5th lead-out wires 22C have respective one ends coupled to the via lands 28 disposed in the 20th, 21st, 22nd, 23rd, and 24th rows. This allows the fifth lead-out wires 22C to be electrically coupled to the logic chip 30B.

Accordingly, in each of the wiring layers M3, M4, and M5, in the same manner as in the wiring layer M2, the lead-out wires 22C can be placed using the plurality of via lands 28 in the six rows (6 row) counted from the reference position RP. Accordingly, in each of the wiring layers M3, M4, and M5 also, the total of 24 lead-out wires 22C can be placed in, e.g., the four columns (4×minimum pitch).

Thus, the silicon interposer 20SB according to the comparative example uses the plurality of via lands 28 formed in the individual wiring layers and disposed in the six rows (6 row) counted from the reference position RP and individually couples the plurality of lead-out wires 22C electrically coupling the memory chip 30A to the logic chip 30B to the plurality of via lands 28.

Accordingly, in the silicon interposer 20SB according to the comparative example, when it is required to further increase the number of the signal transmission paths between the memory chip 30A and the logic chip 30B under the same design rules, it is possible to respond to the requirement by increasing the number of the wiring layers.

However, as described above, when the number of the wiring layers is increased, a problem arises in that the cost of the silicon interposer 20SB increases to consequently increase the cost of the semiconductor device.

<<Structure of Silicon Interposer in Embodiment 2>>

Next, using FIGS. 18A, 18B, and 19, a description will be given of a configuration of the individual wiring layers provided in a silicon interposer 20SA according to Embodiment 2.

Figure 18A:
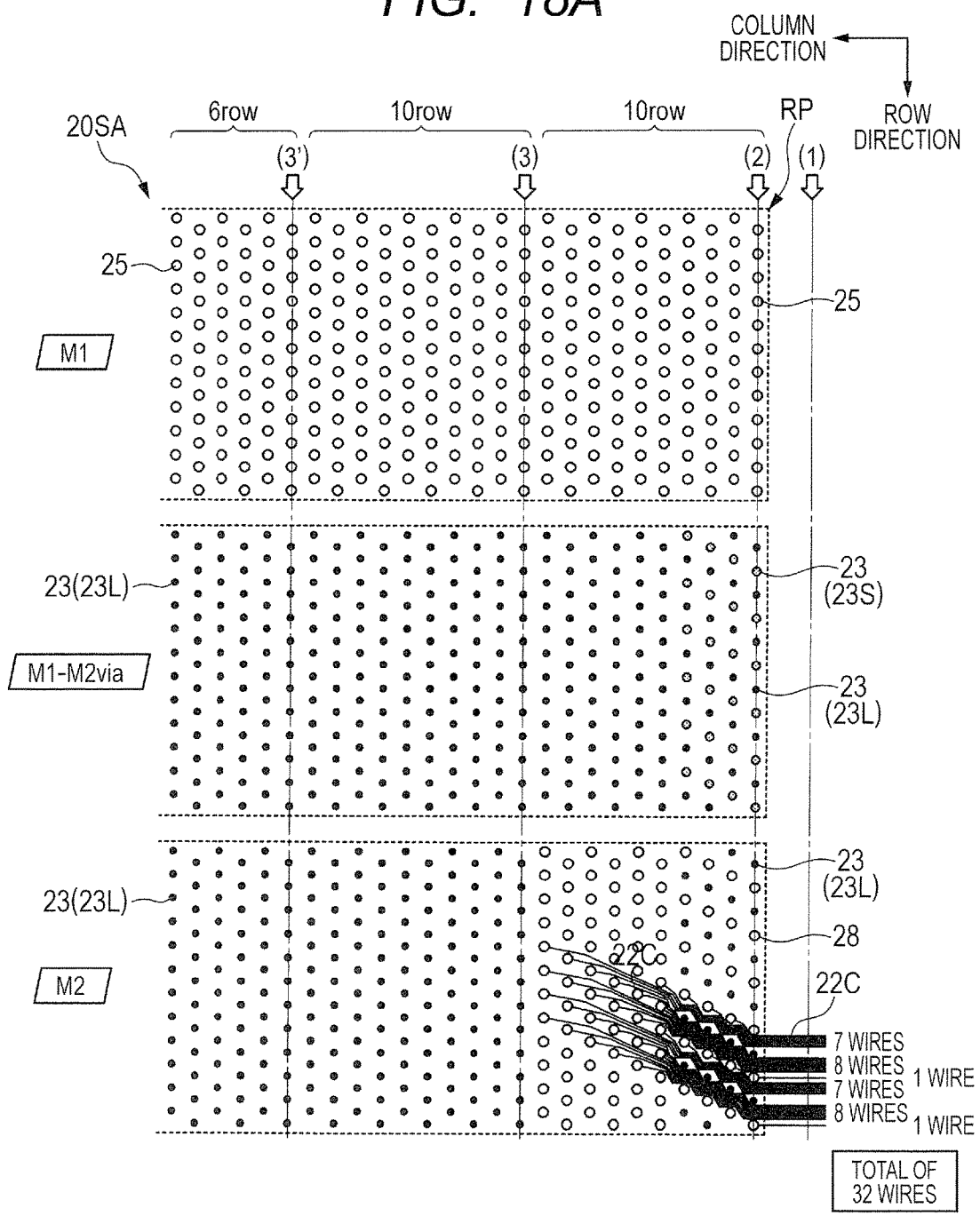
FIG. 18A is a plan view showing a layout of respective portions of the individual wiring layers and via wires which are included in a silicon interposer according to Embodiment 2.
Figure 18B:
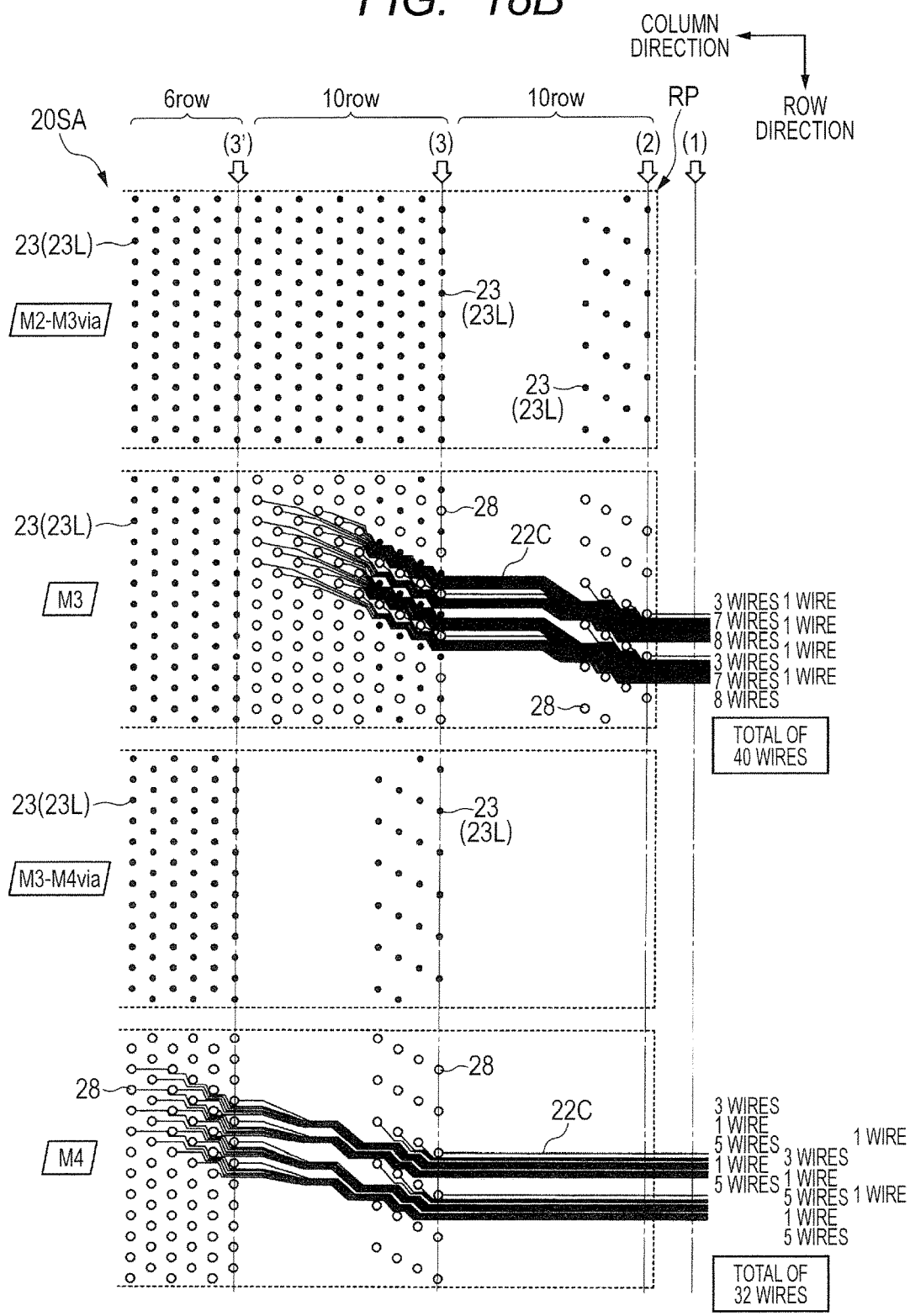
FIG. 18B is a plan view showing a layout of respective portions of the individual wiring layers and via wires which are included in the silicon interposer according to Embodiment 2.

FIGS. 18A and 18B are plan views each showing a layout of respective portions of the individual wiring layers and the via wires which are included in the silicon interposer according to Embodiment 2. FIG. 19 shows cross-sectional views of the silicon interposer according to Embodiment 2, which are along the lines (1), (2), (3), and (3') shown in FIGS. 18A and 18B.

FIGS. 18A and 18B show an example of the layout of the individual wiring layers which are among the wiring layers electrically coupling the memory chip 30A to the logic chip 30B and which form the signal transmission paths in the region where the memory chip 30A is mounted. The layout of the individual wiring layers forming the signal transmission paths in the region where the logic chip 30B is mounted may also be the same as the layout of the individual wiring layers forming the signal transmission paths in the region where the memory chip 30A is mounted, though a description thereof is omitted herein. Alternatively, it is also possible to apply the layout example according to Embodiment 2 only to the layout of the individual wiring layers forming the signal transmission paths in the region where the logic chip 30B is mounted.

By way of example, FIGS. 18A and 18B show the four wiring layers which are the wiring layers M1, M2, M3, and M4 stacked in this order with increasing distance from the upper surface 20t of the silicon interposer 20SA between the upper surface 20t and the upper surface 21t of the core layer 21c (see FIG. 7) as well as the via wires 23 (short via wires 23S and long via wires 23L) coupling the individual wiring layers to each other. The short via wires 23S are shown by the dotted circles, while the long via wires 23L are shown by the solid circles. FIG. 18A shows the layout of the wiring layer M1, the via wires 23 between the wiring layers M1 and M2, and the wiring layer M2. FIG. 18B shows the layout of the via wires 23 between the wiring layers M2 and M3, the wiring layer M3, the via wires 23 between the wiring layers M3 and M4, and the wiring layer M4.

In the example shown in FIGS. 18A and 18B, for the signal transmission paths electrically coupling the memory chip 30A to the logic chip 30B, the plurality of lead-out wires 22C made of the wiring layers M2, M3, and M4 are used. The uppermost wiring layer M1 formed over the upper surface 20t of the silicon interposer 20SA is included only in the plurality of upper-surface terminals 25 and is not used for the lead-out wires 22C.

For example, when it is sufficient to use only the wiring layer M2 to allow the required signal transmission paths to be provided, the lead-out wires 22C made of the wiring layers M3 and M4 is unnecessary. However, to improve the performance of the semiconductor device, a technique which increases the number of data items that can be transmitted between the memory chip 30A and the logic chip 30B is required. To meet the requirement, it is important to increase the number of data items that can be transmitted at a time by increasing the number of the wiring layers each having the plurality of signal transmission paths and increase the number of data items that can be transmitted by increasing the number of times transmission is performed per unit time. Accordingly, by using the plurality of wiring layers and also increasing the number of the lead-out electrodes 22C made of the individual wiring layers, the number of times transmission is performed per unit time is increased to increase the transmission speed of each of the plurality of signal transmission paths.

Figure 19:
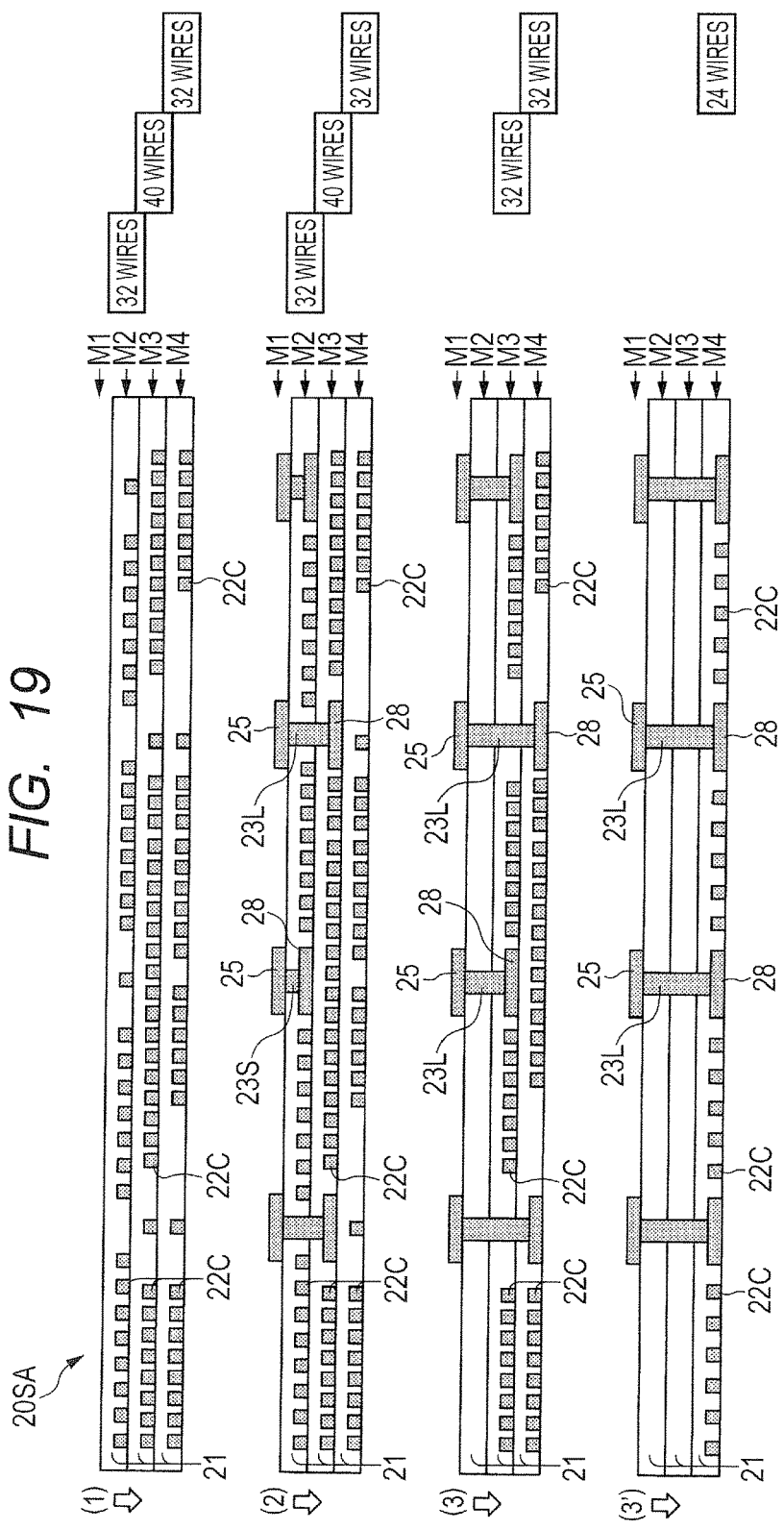
FIG. 19 shows cross-sectional views of the silicon interposer according to Example 2, which are along the lines (1), (2), (3), and (3') shown by the arrows in FIGS. 18A and 18B.

As shown in FIGS. 18A, 18B, and 19, in the silicon interposer 20SA, the plurality of wiring layers, i.e., the wiring layers M2, M3, and M4 are stacked between the upper surface 21t of the core layer 21c using silicon (Si) as a base material and the upper surface 20t of the silicon interposer 20SA (see FIG. 7). In addition, the insulating layers 21 which provide electrical insulation between the plurality of wiring layers are formed. In each of the insulating layers 21, the plurality of via wires 23 for electrically coupling the upper wiring layer to the lower wiring layer are formed (see FIG. 7).

In the silicon interposer 20SA, as shown in the silicon interposer 20SB according to the comparative example, every time a wiring layer is stacked, the via wires 23 are stacked on the via lands 28 to achieve through coupling between the upper and lower wiring layers. In addition, the silicon interposer 20SA has the via wires 23 which extend from the wiring layer M1 (upper-surface terminals 25) to achieve direct through coupling between the wiring layer M1 and the wiring layer M3 or M4 without intervention of the via lands 28. That is, the plurality of via wires 23 include the via wire 23 which directly couples the wiring layer M1 to the wiring layer M3 without intervention of the via land 28 made of the wiring layer M2 and the via wire 23 which directly couples the wiring layer M1 to the wiring layer M4 without intervention of the via land 28 made of the wiring layers M2 and M3. As a result, in each of the wiring layers, there is a region where the plurality of via lands 28 coupled to the lead-out wires 22C are not arranged at the same pitch in a staggered array configuration.

For example, among the plurality of via lands 28 made of the wiring layer M4 shown in FIG. 18B, the via lands 28 (11 row to 14 row) closer to the reference position RP are arranged at double the pitch of the upper-surface terminals 25 in the row direction or column direction. However, the via lands 28 (21 row to 26 row) further away from the reference position RP are arranged at the same pitch as that of the upper-surface terminals 25 in a staggered configuration in the row direction or in the column direction.

The following will specifically describe a configuration of the via wires 23, the via lands 28, and the lead-out wires 22C in the silicon interposer 20SA according to Embodiment 2.

In the following description, the position where the chip end portion (side surface 30s shown in FIG. 3) of the memory chip 30A which faces the logic chip 30B overlaps the silicon interposer 20SA in plan view is assumed to be the reference position RP, and the row of the via wires 23 which is disposed at the position closest to the reference position RP along the reference position RP is assumed to be the 1st row. The rows equidistantly arranged in succession in the direction from the reference position RP toward the inside of the memory chip 30A are hereinafter assumed to be the 2nd, 3rd, and subsequent rows.

Accordingly, the plurality of lead-out wires 22C extend from the via lands 28 provided in each of the rows (1st, 2nd, 3rd, and subsequent rows) in each of the plurality of wiring layers toward the logic chip 30B so as to traverse the reference position RP.

According to the set values of the layout rules shown in FIG. 17, since the minimum pitch (Min pitch) is 55 µm, it follows that the plurality of via wires 23 and the plurality of via lands 28 can be arranged at a 55 µm pitch in the row direction.

[About Wiring Layer M2]

In the example of the wiring layer M2 shown in FIGS. 18A, 18B, and 19, in the 1st row closest to the reference position RP, the short via wires 23S coupling the wiring layer M1 (upper-surface terminals 25) to the wiring layer M2 and the long via wires 23L coupling the wiring layer M1 (upper-surface terminals 25) to the wiring layer M3 are alternately arranged in the row direction. The short via wires 23S and the long via wires 23L are arranged at the minimum pitch in the row direction. In each of the 2nd, 3rd, and 4th rows also, the short via wires 23S and the long via wires 23L are similarly alternately arranged in the row direction. In each of the 5th to 10th rows, the via lands 28 made of the wiring layer M2 are arranged at the minimum pitch in a staggered array configuration.

In the portions of the wiring layer M2 which are coupled to the short via wires 23S, the via lands 28 made of the wiring layer M2 are formed. In the portions of the wiring layer M3 which are coupled to the long via wires 23L, the via lands 28 made of the wiring layer M3 are formed.

The plurality of via lands 28 made of the wiring layer M2 in the 1st, 2nd, 3rd, and 4th rows are coupled individually to the lead-out wires 22C extending in the direction toward the logic chip 30B.

According to the set values of the layout rules shown in FIG. 17, since the spacing between the via land 28 and the long via wire 23L which are adjacent to each other in the row direction in the 1st row is 37.5 µm, the maximum of eight lead-out wires 22C made of the wiring layer M2 are allowed to extend therebetween. Likewise, in each of the 2nd, 3rd, and 4th rows also, between the via land 28 and the long via wire 23L which are adjacent to each other in the row direction, the maximum of eight lead-out wires 22C made of the wiring layer M2 are allowed to extend. Each of the seven or eight lead-out wires 22C made of the wiring layer M2 and extending between the via land 28 and the long via wire 23L which are adjacent to each other in the row direction in the 1st to 4th rows is coupled to any of the plurality of via lands 28 disposed in the 5th to 10th rows.

This allows the plurality of via lands 28 arranged in the 5th to 10th rows to be electrically coupled to the logic chip 30B via the lead-out wires 22C.

Note that the spacing between two of the plurality of via lands 28 disposed in the 5th to 10th rows which are adjacent to each other in the row direction is 25 µm. This allows the maximum of five lead-out wires 22C made of the wiring layer M2 to extend therebetween.

Accordingly, in the wiring layer M2, the lead-out wires 22C can be placed using the via lands 28 disposed in the ten rows (10 row) counted from the reference position RP. For example, in the four columns (4×minimum pitch), the total of 32 lead-out wires 22C can be placed.

As shown in FIGS. 18A, 18B, and 19, under the via lands 28 made of the wiring layer M2 and coupled to the lead-out wires 22C, neither the via wires 23 nor the via lands 28 are formed, and the lead-out wires 22C made of the wiring layer M3 or M4 extend via the insulating layer 21.

[About Wiring Layer M3]

In the example of the wiring layer M3 shown in FIGS. 18A, 18B, and 19, in each of the 1st, 2nd, 3rd, and 4th rows, the via lands 28 coupled to the wiring layer M1 (upper-surface terminals 25) via the long via wires 23L are disposed. Since these via lands 28 include only the via lands 28 each coupled to the upper-surface terminal 25 made of the wiring layer M1 via the long via wire 23L, the via lands 28 adjacent to each other in the row direction are arranged at double the minimum pitch. These via lands 28 are coupled individually to the lead-out wires 22C extending in the direction toward the logic chip 30B. In the 5th to 10th rows, the via lands 28 are not disposed.

In the 11th row, the long via wires 23L coupling the wiring layer M1 (upper-surface terminals 25) to the wiring layer M3 and the long via wires 23L coupling the wiring layer M1 (upper-surface terminals 25) to the wiring layer M4 are alternately arranged in the row direction. These long via wires 23L are arranged at the minimum pitch in the row direction. Likewise, in each of the 12th, 13th, and 14th rows also, the long via wires 23L coupling the wiring layer M1 (upper-surface terminals 25) to the wiring layer M3 and the long via wires 23L coupling the wiring layer M1 (upper-surface terminals 25) to the wiring layer M4 are alternately arranged in the row direction. In each of the 15th to 20th rows, the via lands 28 made of the wiring layer M3 are arranged at the minimum pitch in a staggered array configuration.

In the portions of the wiring layer M3 which are coupled to the long via wires 23L between the wiring layers M1 and M3, the via lands 28 made of the wiring layer M3 are formed. In the portions of the wiring layer M4 which are coupled to the long via wires 23L between the wiring layers M1 and M4, the via lands 28 made of the wiring layer M4 are formed.

The plurality of via lands 28 made of the wiring layer M3 in the 11th, 12th, 13th, and 14th rows are coupled individually to the lead-out wires 22C extending in the direction toward the logic chip 30B.

According to the set values of the layout rules shown in FIG. 17, since the spacing between the via land 28 and the long via wire 23L which are adjacent to each other in the row direction in the 11th row is 37.5 µm, the maximum of eight lead-out wires 22C made of the wiring layer M3 are allowed to extend therebetween. Likewise, in each of the 12th, 13th, and 14th rows also, between the via land 28 and the long via wire 23L which are adjacent to each other in the row direction, the maximum of eight lead-out wires 22C made of the wiring layer M3 are allowed to extend. Each of the seven or eight lead-out wires 22C made of the wiring layer M3 and extending between the via land 28 and the long via wire 23L which are adjacent to each other in the row direction in the 11th to 14th rows is coupled to any of the plurality of via lands 28 disposed in the 15th to 20th rows.

This allows the plurality of via lands 28 arranged in the 15th to 20th rows to be electrically coupled to the logic chip 30B via the lead-out wires 22C.

Note that the spacing between two of the plurality of via lands 28 disposed in the 15th to 20th rows which are adjacent to each other in the row direction is 25 µm. This allows the maximum of five lead-out wires 22C made of the wiring layer M5 to extend therebetween.

According to the set values of the layout rules shown in FIG. 17, the spacing between the via lands 28 adjacent to each other in the row direction in the 1st to 4th rows is 80 µm. This allows the maximum of 19 lead-out wires 22C to extend therebetween.

Accordingly, in the wiring layer M3, the lead-out wires 22C can be placed using the via lands 28 disposed in the 20 rows (20 row) counted from the reference position RP. For example, in the four columns (4×minimum pitch), the total of 40 lead-out wires 22C can be placed.

As shown in FIGS. 18A, 18B, and 19, under the via lands 28 made of the wiring layer M3 and coupled to the lead-out wires 22C, neither the via wires 23 nor the via lands 28 are formed, and the lead-out 22C wires made of the wiring layer M4 extend via the insulating layer 21.

[About Wiring Layer M4]

In the example of the wiring layer M4 shown in FIGS. 18A, 18B, and 19, in each of the 11ty, 12th, 13th, and 14th rows, the via lands 28 coupled to the wiring layer M1 (upper-surface terminals 25) via the long via wires 23L are disposed. Since these via lands 28 include only the via lands 28 each coupled to the upper-surface terminal 25 made of the wiring layer M1 via the long via wire 23L, the via lands 28 adjacent to each other in the row direction are arranged at double the minimum pitch. These via lands 28 are coupled individually to the lead-out wires 22C extending in the direction toward the logic chip 30B. In the 15th to 20th rows, the via lands 28 are not disposed.

In the 21st row, the plurality of long via wires 23L coupling the wiring layer M1 (upper-surface terminals 25) to the wiring layer M4 are arranged at the minimum pitch in the row direction. In each of the 22nd, 23rd, 24th, 25th, and 26th rows also, the plurality of long via wires 23L coupling the wiring layer M1 (upper-surface terminals 25) to the wiring layer M4 are arranged at the minimum pitch in the row direction.

In the 21st to 26th rows, in the portions of the wiring layer M4 which are coupled to the long via wires 23L, the via lands 28 made of the wiring layer M4 are formed. The plurality of via lands 28 are arranged at the minimum pitch in a staggered array configuration.

The plurality of via lands 28 in the 21st to 26th rows made of the wiring layer M4 are coupled individually to the lead-out wires 22C extending in the direction toward the logic chip 30B.

According to the set values of the layout rules shown in FIG. 17, the spacing between two of the plurality of via lands 28 disposed in the 21st to 26th rows which are adjacent to each other in the row direction is 25 μm. This allows the maximum of five lead-out wires 22C made of the wiring layer M4 to extend therebetween.

According to the set values of the layout rules shown in FIG. 17, the spacing between the via lands 28 adjacent to each other in the row direction in the 11th to 14th rows is 80 μm. This allows the maximum of 19 lead-out wires 22C to extend therebetween.

Accordingly, in the wiring layer M4, the lead-out wires 22C can be placed using the via lands 28 disposed in the 16 rows (16 row) counted from the reference position RP. For example, in the four columns (4×minimum pitch), the total of 32 lead-out wires 22C can be placed.

<<Effects Achieved by Interposer in Embodiment 2>>

As described above, in Embodiment 2, instead of forming the via lands 28 made of the wiring layers M2 and M3 between the uppermost wiring layer M1 and the lowermost wiring layer M4, the respective long via wires 23L coupling the wiring layer M1 (upper-surface terminals 25) to the wiring layer M3 and coupling the wiring layer M1 (upper-surface terminals 25) to the wiring layer M4 are formed. In other words, in the silicon interposer 20SA, the plurality of via wires 23 at different depth are formed.

The spacing between the via land 28 and the long via wire 23L which are adjacent to each other and spaced apart by a minimum distance in the row direction or in a diagonal direction between the rows is larger than the spacing between the adjacent via lands 28 spaced apart by a minimum distance in the row direction or in a diagonal direction between the rows. This allows the number of the lead-out wires 22C that can be placed between the via land 28 and the long via wire 23L which are adjacent to each other and spaced apart by the minimum distance in the row direction or in a diagonal direction between the rows to be larger than the number of the lead-out wires 22C that can be placed between the adjacent via lands 22C spaced apart by the minimum distance in the row direction or in a diagonal direction between the rows.

In the direction from the reference position RP of the silicon interposer 20SA toward the inside of the memory chip 30A, the respective long via wires 23L coupling the wiring layer M1 (upper-surface terminals 25) to the wiring layer M3 and coupling the wiring layer M1 (upper-surface terminals 25) to the wiring layer M4 are arranged in this order. This allows the lead-out wires 22C made of the wiring layer M3 to be placed under the wiring layer M2 and allows the lead-out wires 22C made of the wiring layer M4 to be disposed under the wiring layers M2 and M3.

According to the set values of the layout rules shown in FIG. 17, between the adjacent via lands 28 arranged at the minimum pitch in the row direction, the five lead-out wires 22C can be placed. For instance, in the example (silicon interposer 20SB according to the comparative example) shown in FIGS. 15 and 16, in the four columns (4×minimum pitch), the 96 (24+24+24+24) lead-out wires 22C can be placed using the wiring layers M2, M3, M4, and M5.

However, according to the set values of the layout rules shown in FIG. 17, between the via land 28 and the long via wire 23L which are adjacent to each other and arranged at the minimum pitch in the row direction, the maximum of eight lead-out wires 22C can be placed. Also, according to the set values of the layout rules shown in FIG. 17, between the adjacent via lands 28 arranged at double the minimum pitch in the row direction, the maximum of 19 lead-out wires 22C can be placed. For instance, in the example (silicon interposer 20SA according to Embodiment 2) shown in FIGS. 18A, 18B, and 19, in the four columns (4×minimum pitch), the 104 (32+40+32) lead-out wires 22C can be placed using the wiring layers M2, M3, and M4.

Thus, Embodiment 2 requires a technique which increases the number of data items that can be transmitted between the memory chip 30A and the logic chip 30B by increasing the number of the lead-out wires 22C made of the individual wiring layers without increasing the number of the wiring layers. To meet the requirement, it is important to increase the number of data items that can be transmitted at a time by increasing the number of the wiring layers each having the plurality of signal transmission paths and increase the number of data items that can be transmitted by increasing the number of times transmission is performed per unit time. As a result, it is possible to provide the silicon interposer 20SA having a high transmission speed at low cost.

While the invention achieved by the present inventors has been specifically described heretofore on the basis of the embodiments thereof, the present invention is not limited to the embodiments described above. It will be appreciated that various changes and modifications can be made in the invention within the scope not departing from the gist thereof.

For example, the embodiments described above use the interposer using the insulating material obtained by impregnating a fibrous material such as glass fiber with a resin material such as an epoxy resin as the base material and the interposer using silicon (Si) as the base material. However, the interposer is not limited thereto. It is also possible to use an interposer using glass as a base material.

In each of the embodiments described above, the present invention is applied to the interposer functioning as an interposer substrate in so-called 2.5-dimensional (2.5D) mounting in which the interposer is mounted over the package substrate and, over the interposer, the plurality of semiconductor chips are further mounted. However, the present invention is also applicable to a wiring substrate with a so-called 2.1-dimensional (2.1D) structure in which a plurality of semiconductor chips are mounted over an interposer. The interposer in the wiring substrate with the 2.1D structure has an additional layer that allows micro wires smaller than in a typical wiring substrate to be formed over a printed wiring substrate using a thin-film technique or has an embedded chip.

What is claimed is:

1. A semiconductor device, comprising:
a wiring substrate having a main surface, a rear surface opposite the main surface, and a plurality of external electrodes formed on the rear surface;
an interposer mounted over the main surface of the wiring substrate and having an upper surface and a lower surface opposite the upper surface; and
first and second semiconductor chips mounted on the upper surface of the interposer such that the first semiconductor chip and the second semiconductor chip are arranged side by side in plan view,
wherein the interposer has:
a plurality of wiring layers disposed between the upper and lower surfaces;
a plurality of land electrodes each formed of the wiring layers;
a plurality of wires each formed of the wiring layers and electrically coupled individually to the land electrodes; and
a plurality of through electrodes electrically coupling the wiring layers to each other,
wherein the wiring layers include a first wiring layer, a second wiring layer disposed closer to the lower surface than the first wiring layer, a third wiring layer disposed closer to the lower surface than the first wiring layer, and a fourth wiring layer disposed between the first and second wiring layers and between the first and third wiring layers,
wherein the land electrodes include first and second land electrodes each formed of the first wiring layer, a third land electrode formed of the second wiring layer, and a fourth land electrode formed of the third wiring layer,
wherein the through electrodes include a first through electrode extending through the fourth wiring layer and having one end coupled to the first land electrode and the other end coupled to the third land electrode and a second through electrode extending through the fourth wiring layer and having one end coupled to the second land electrode and the other end coupled to the fourth land electrode,
wherein some of the wires formed of the fourth wiring layer are placed between the first and second through electrodes,
wherein the first land electrode overlaps the third land electrode in plan view,
wherein the first through electrode is arranged between the first and third land electrodes in a cross-section view,
wherein the second land electrode overlaps the fourth land electrode in plan view,
wherein the second through electrode is arranged between the second and fourth land electrodes in cross-section view, and
wherein, in cross-section view, a length between the first and second through electrodes in the fourth wiring layer is greater than a length between the first and second land electrodes in the first wiring layer in a direction from the first through electrode to the second through electrode.

2. The semiconductor device according to claim 1,
wherein the fourth wiring layer has neither the land electrode coupled to the first through electrode nor the land electrode coupled to the second through electrode.

3. The semiconductor device according to claim 1,
wherein, between the first and third land electrodes, the first through electrode is coupled to none of the land electrodes formed of the fourth wiring layer.

4. The semiconductor device according to claim 1,
wherein, between the second and fourth land electrodes, the second through electrode is coupled to none of the land electrodes formed of the fourth wiring layer.

5. The semiconductor device according to claim 1,
wherein some of the wires placed between the first and second through electrodes and formed of the fourth wiring layer form a transmission path electrically coupling the first and second semiconductor chips to each other.

6. The semiconductor device according to claim 1,
wherein the second and third wiring layers are the same layer.

7. The semiconductor device according to claim 1,
wherein the land electrodes further include a fifth land electrode formed of the first wiring layer and a sixth land electrode formed of the fourth wiring layer,
wherein the through electrodes further include a third through electrode having one end coupled to the fifth land electrode and the other end coupled to the sixth land electrode,
wherein the first, second, and third through electrodes are formed in a region of the interposer which overlaps the first semiconductor chip in plan view, and
wherein a first distance from a first position at the interposer which overlaps a side surface of the first chip facing the second semiconductor chip in plan view to the first through electrode and a second distance from the first position to the second through electrode are longer than a third distance from the first position to the third through electrode.

8. The semiconductor device according to claim 7,
wherein some of the wires formed of the second wiring layer or the third wiring layer are placed so as to overlap the sixth land electrode in plan view.

9. The semiconductor device according to claim 1,
wherein a base material of the interposer is an insulating material obtained by impregnating a glass fiber with an epoxy resin.

10. The semiconductor device according to claim 1,
wherein a base material of the interposer is silicon.

11. The semiconductor device according to claim 1,
wherein a base material of the interposer is glass.

12. The semiconductor device according to claim 1,
wherein the interposer serves also as a wiring substrate.

13. The semiconductor device according to claim 1,
wherein some of the wires of the interposer form a GND wire with a coplanar structure.

14. The semiconductor device according to claim 6,
wherein, in cross-section view, the length between the first and second through electrodes in the fourth wiring layer is greater than a length between the third and fourth land electrodes in the second wiring layer in the direction, and wherein the second wiring layer has a plurality of first wirings which are arranged between the third and fourth land electrodes in the second wiring layer in cross-section view, wherein the fourth wiring layer has a plurality of second wirings between the first and second through electrodes in the fourth wiring layer in cross-section view, and wherein the number of the second wirings is greater than the number of the first wirings in cross-section view.

* * * * *